(12) United States Patent
Sekiguchi

(10) Patent No.: US 8,026,545 B2
(45) Date of Patent: Sep. 27, 2011

(54) EEPROM

(75) Inventor: Yushi Sekiguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/591,777

(22) Filed: Dec. 1, 2009

(65) Prior Publication Data

US 2010/0133603 A1    Jun. 3, 2010

(30) Foreign Application Priority Data

Dec. 1, 2008 (JP) ................................ 2008-306674
Dec. 9, 2008 (JP) ................................ 2008-313302

(51) Int. Cl.
| | |
|---|---|
| H01L 27/118 | (2006.01) |
| H01L 29/66 | (2006.01) |
| H01L 29/788 | (2006.01) |
| H01L 21/70 | (2006.01) |
| H01L 27/07 | (2006.01) |
| H01L 27/088 | (2006.01) |
| H01L 27/115 | (2006.01) |
| G11C 7/22 | (2006.01) |
| G11C 7/00 | (2006.01) |
| G06F 13/00 | (2006.01) |
| G06F 13/28 | (2006.01) |

(52) U.S. Cl. ........ 257/321; 257/202; 257/368; 257/390; 257/204; 257/317; 257/319; 257/320; 257/315; 257/E27.027; 257/E27.028; 257/E27.103; 257/E27.06; 365/220; 365/221; 365/189.011; 711/103

(58) Field of Classification Search .................. 365/220, 365/221, 189.011; 257/321, 202, 368, 390, 257/204, 317, 319, 320, 315, E27.029, E27.028, 257/E27.103, E27.06; 711/103
See application file for complete search history.

(56) References Cited

U.S. PATENT DOCUMENTS

| | | | |
|---|---|---|---|
| 5,420,060 A * | 5/1995 | Gill et al. | ...................... 438/261 |
| 6,933,557 B2 * | 8/2005 | Lojek | ............................. 257/315 |

FOREIGN PATENT DOCUMENTS

| | | |
|---|---|---|
| EP | 2109136 A1 | 10/2009 |
| JP | 2008-186932 A | 8/2008 |

* cited by examiner

*Primary Examiner* — Phat Cao
*Assistant Examiner* — Diana Garrity
(74) *Attorney, Agent, or Firm* — Rabin & Berdo, PC

(57) ABSTRACT

An EEPROM according to the present invention includes: a semiconductor layer of a first conductive type; and a first insulating film formed on the semiconductor layer. A first impurity region, a second impurity region, a third impurity region, a fourth impurity region, and a fifth impurity region of a second conductive type are formed in top layer portions of the semiconductor layer. On the first insulating film, a select gate, a first floating gate, and a second floating gate are respectively disposed opposite a region between the first impurity region and the second impurity region, a region between the second impurity region and the third impurity region, and a region between the third impurity region and the fourth impurity region. In the first insulating film, a first tunnel window and a second tunnel window are respectively formed at portions in contact with the first floating gate and the second floating gate. A sixth impurity region of the second conductive type, which is connected to the second impurity region, is formed in a portion of the top layer portion of the semiconductor layer that opposes the second tunnel window.

5 Claims, 18 Drawing Sheets

71

71

EEPROM

BACKGROUND OF THE INVENTION

1. Field of the Invention

The present invention relates to a W (double) cell type EEPROM (electrically erasable programmable read only memory).

2. Description of the Related Art

An EEPROM is known as a representative example of a nonvolatile memory. There are EEPROMs that employ a W cell system in which the same data are held in two memory cells (memory transistors). With a W cell type EEPROM, even when one of the memory cells malfunctions, data can be read from and written into the other memory cell.

FIG. 21 is a schematic plan view of a conventional W cell type EEPROM. FIG. 22 is a schematic sectional view taken on cutting line XXII-XXII of the EEPROM shown in FIG. 21. FIGS. 23 and 24 are circuit diagrams of the EEPROM shown in FIG. 21.

The EEPROM includes a P type silicon substrate 101. A first insulating film 102, made of $SiO_2$ (silicon oxide), is formed on the silicon substrate 101. Further, in a top layer portion of the silicon substrate 101, an element isolation portion 103 is formed at a portion excluding an active region 104 with a rectangular shape in plan view. In FIG. 21, an outline of the active region 104 is indicated by thick lines. The element isolation portion 103 has, for example, a structure in which an insulator is embedded in a shallow trench formed by digging comparatively shallowly from the top surface.

In top layer portions of the silicon substrate 101 in the active region 104, five N type impurity regions 105 to 109 are formed and aligned at predetermined intervals in a longitudinal direction of the active region 104. The impurity regions 105 to 109 that are aligned from one end side to another end side in the longitudinal direction of the active region 104 shall be the first to fifth impurity regions 105 to 109, respectively.

On the first insulating film 102, a first select gate 110 is formed in a line-like manner extending in a direction orthogonal to the longitudinal direction of the active region 104 at a position opposing a region between the first impurity region 105 and the second impurity region 106. Further, on the first insulating film 102, a first floating gate 111 is formed at a position opposing a region between the second impurity region 106 and the third impurity region 107. A second insulating film 112, made of $SiO_2$, is formed on the first floating gate 111. On the second insulating film 112, a first control gate 113 is formed in a line-like manner extending in a direction orthogonal to the longitudinal direction of the active region 104. In the first insulating film 102, a first tunnel window 114 is formed by decreasing a thickness of a part of a portion sandwiched between the second impurity region 106 and the first floating gate 111.

The EEPROM is thus provided with a first select transistor STr1, which includes the first impurity region 105, the second impurity region 106 and the first select gate 110, and a first memory transistor MTr1, which includes the second impurity region 106, the third impurity region 107, the first floating gate 111 and the first control gate 113, as shown in FIGS. 23 and 24.

Further, as shown in FIGS. 21 and 22, on the first insulating film 102, a second select gate 115 is formed in a line-like manner extending in a direction orthogonal to the longitudinal direction of the active region 104 at a position opposing a region between the third impurity region 107 and the fourth impurity region 108. Still further, on the first insulating film 102, a second floating gate 116 is formed at a position opposing a region between the fourth impurity region 108 and the fifth impurity region 109. A third insulating film 117, made of $SiO_2$, is formed on the second floating gate 116. On the third insulating film 117, a second control gate 118 is formed in a line-like manner extending in a direction orthogonal to the longitudinal direction of the active region 104. In the first insulating film 102, a second tunnel window 119 is formed by decreasing a thickness of a part of a portion sandwiched between the fourth impurity region 108 and the second floating gate 116.

The EEPROM is thus provided with a second select transistor STr2, which includes the third impurity region 107, the fourth impurity region 108 and the second select gate 115, and a second memory transistor MTr2, which includes the fourth impurity region 108, the fifth impurity region 109, the second floating gate 116 and the second control gate 118, as shown in FIGS. 23 and 24. The first memory transistor MTr1 and the second select transistor STr2 are connected by the third impurity region 107, which is a source region of the first memory transistor MTr1, being used in common as a drain region of the second select transistor STr2.

As shown in FIG. 22, an interlayer insulating film 120 is laminated on the silicon substrate 101. The first insulating film 102, the first select gate 110, the first control gate 113, the second select gate 115 and the second control gate 118 are covered all together by the interlayer insulating film 120. In the interlayer insulating film 120, contact plugs 121 to 123 for respectively connecting the first impurity region 105, the third impurity region 107 and the fifth impurity region 109 with wirings (not shown) formed on the interlayer insulating film 120, are embedded.

As shown in FIG. 23, when data are to be written into the first memory transistor MTr1, the first control gate 113, the second select gate 115 and the second control gate 118 are set to a ground potential (GND). Further, the third impurity region 107, which is the source region of the first memory transistor MTr1, and the fifth impurity region 109, which is the source region of the second memory transistor MTr2, are set to an open state (OPEN). Then, a programming voltage Vpp (for example, 15 to 20V) is applied to the first impurity region 105, which is the drain region of the first select transistor STr1, and to the first select gate 110. The first select transistor STr1 is thereby turned on and a high electric field is formed between the second impurity region 106, which is the drain region of the first memory transistor MTr1, and the first floating gate 111. When this high electric field is formed, electrons are drawn from the first floating gate 111 into the second impurity region 106, and writing of data into the first memory transistor MTr1 is thereby achieved.

Meanwhile, as shown in FIG. 24, when data are to be written into the second memory transistor MTr2, the second control gate 118 is set to the ground potential (GND). Further, the fifth impurity region 109, which is the source region of the second memory transistor MTr2, is set to the open state (OPEN). Then, the programming voltage Vpp is applied to the third impurity region 107, which is the drain region of the second select transistor STr2, and to the second select gate 115. The second select transistor STr2 is thereby turned on and a high electric field is formed between the fourth impurity region 108, which is the drain region of the second memory transistor MTr2, and the second floating gate 116. When this high electric field is formed, electrons are drawn from the second floating gate 116 into the fourth impurity region 108, and writing of data into the second memory transistor MTr2 is thereby achieved.

In this state, the first impurity region 105, which is the drain region of the first select transistor STr1, is set to the open state, and the first select gate 110 and the first control gate 113 are set to the ground potential. However, the first memory transistor MTr1 is turned on because the program voltage Vpp, which is a comparatively high voltage, is applied to the third impurity region 107 which is the source region of the first memory transistor MTr1. A high electric field is thereby formed across the second impurity region 106, which is the drain region of the first memory transistor MTr1, and the first floating gate 111, and electrons may be drawn from the first floating gate 111 into the second impurity region 106.

Further, depending on a state (electron accumulation state) of the first floating gate 111, a current leaks from the third impurity region 107, which is the source region of the first memory transistor MTr1, to the second impurity region 106, which is the drain region, thereby causing reduction of efficiency of writing data into the second memory transistor MTr2 (loss of the programming voltage Vpp applied to the third impurity region 107).

Still further, with the conventional EEPROM, data cannot be written simultaneously into the two transistors of the first memory transistor MTr1 and the second memory transistor MTr2, and there is thus a problem that the writing of data takes time.

SUMMARY OF THE INVENTION

A first object of the present invention is to provide an EEPROM with which the same data can be written into two memory transistors reliably.

A second object of the present invention is to provide an EEPROM with which improvement of data writing efficiency and reduction of data writing time can be achieved.

An EEPROM according to one aspect of the present invention includes: a semiconductor layer of a first conductive type; a first insulating layer formed on the semiconductor layer; an element isolation portion formed selectively in a top surface of the semiconductor layer and surrounding an active region; a first impurity region of a second conductive type formed in a top layer portion of the semiconductor layer in the active region; a second impurity region of the second conductive type formed at an interval from the first impurity region in a top layer portion of the semiconductor layer in the active region; a select gate formed on the first insulating film and opposing a region between the first impurity region and the second impurity region; a third impurity region of the second conductive type formed at an interval from the second impurity region in a top layer portion of the semiconductor layer in the active region; a first floating gate formed on the first insulating film and opposing a region between the second impurity region and the third impurity region; a second insulating film formed on the first floating gate; a first control gate formed on the second insulating film; a fourth impurity region of the second conductive type formed at an interval from the third impurity region in a top layer portion of the semiconductor layer in the active region; a second floating gate formed on the first insulating film and opposing a region between the third impurity region and the fourth impurity region; a third insulating film formed on the second floating gate; a second control gate formed on the third insulating film; a first tunnel window formed by decreasing a thickness of a part of a portion of the first insulating film in contact with the first floating gate; a fifth impurity region of the second conductive type formed in a top layer portion of the semiconductor layer opposing the first tunnel window and connected to the second impurity region; a second tunnel window formed by decreasing a thickness of a part of a portion of the first insulating film in contact with the second floating gate; and a sixth impurity region of the second conductive type formed in a top layer portion of the semiconductor layer opposing the second tunnel window and connected to the second impurity region.

The first impurity region, the second impurity region, and the select gate opposing the region between the first impurity region and the second impurity region across the first insulating film, make up a select transistor. The second impurity region, the third impurity region, the fifth impurity region, the first floating gate opposing the fifth impurity region and the region between the second impurity region and the third impurity region across the first insulating film, the second insulating film, and the first control gate make up a first memory transistor. The third impurity region, the fourth impurity region, the second floating gate opposing the sixth impurity region and the region between the third impurity region and the fourth impurity region across the first insulating film, the third insulating film, and the second control gate, make up a second memory transistor.

When in a state where the first control gate and the second control gate are set to a ground potential and the fourth impurity region is set to an open state, a programming voltage Vpp is applied to the first impurity region and the select gate, the select transistor turns on and high electric fields are formed between the fifth impurity region connected to the second impurity region and the first floating gate, and between the sixth impurity region connected to the second impurity region and the second floating gate, respectively. By the high electric fields, carriers are drawn from the first floating gate and the second floating gate into the fifth impurity region and the sixth impurity region respectively, and thereby writing of data into the first and second memory transistors is achieved.

The same data can thus be written into the first and second memory transistors simultaneously. Thus, unlike in an arrangement in which the same data are written individually into two memory transistors, the same data can be written reliably into the two memory transistors (the first and second memory transistors).

The fifth impurity region and the sixth impurity region may be adjacent and made integral in a predetermined direction, and the sixth impurity region may be connected to the second impurity region via the fifth impurity region.

In this case, the respective portions may be formed as follows. The first impurity region opposes the second impurity region in the predetermined direction. The second impurity region extends in a direction orthogonal to the predetermined direction. The third impurity region opposes, in the predetermined direction at a side opposite the first impurity region side, one end portion of the second impurity region in the direction orthogonal to the predetermined direction. The fourth impurity region opposes the third impurity region in the predetermined direction. The fifth impurity region is connected, from the side opposite the first impurity region side, to the other end portion of the second impurity region at the opposite side of the one end portion. The select gate, the first floating gate, and the second floating gate extend in the direction orthogonal to the predetermined direction.

Further, the active region may include: a first portion extending in the predetermined direction; a second portion extending in the predetermined direction and spaced from the first portion in the direction orthogonal to the predetermined direction; and a third portion connecting respective one end portions in the predetermined direction of the first portion and the second portion. Then, the first impurity region and the second impurity region may be formed in the third portion, the third impurity region and the fourth impurity region may be formed in the first portion, and the fifth impurity region and the sixth impurity region may be formed in the second portion.

The first tunnel window and the second tunnel window are obtained, for example, by forming an insulating film on an entire top surface of the semiconductor layer, removing the insulating film from portions where the first tunnel window and the second tunnel window are to be formed, and thereafter forming a new insulating film relatively thinly at the portions where the insulating film was removed. As a method for removing the insulating film, wet etching is adopted instead of dry etching to prevent damaging the semiconductor layer. However, it is difficult to perform fine patterning of the insulating film with wet etching, and thus with an arrangement in which the first tunnel window and the second tunnel window are formed to be mutually separated, the forming of the first tunnel window and the second tunnel window is an impediment to size reduction of the memory cells.

Meanwhile, in a case where the first tunnel window and the second tunnel window are adjacent and made integral in the predetermined direction, fine patterning of the insulating film is not required for forming the integral tunnel window. By making respective portions of the integral tunnel window that overlap with the first floating gate and the second floating gate have the minimum necessary sizes, the sizes of the memory cells can be reduced while making fine patterning of the insulating film unnecessary.

An EEPROM according to another aspect of the present invention includes: a semiconductor layer of a first conductive type; a first insulating film formed on the semiconductor layer; a first impurity region of a second conductive type formed in a top layer portion of the semiconductor layer; a second impurity region of the second conductive type formed at an interval from the first impurity region in a top layer portion of the semiconductor layer; a first select gate formed on the first insulating film and opposing a region between the first impurity region and the second impurity region; a third impurity region of the second conductive type formed at an interval from the second impurity region in a top layer portion of the semiconductor layer; a first floating gate formed on the first insulating film and opposing a region between the second impurity region and the third impurity region; a second insulating film formed on the first floating gate; a first control gate formed on the second insulating film; a fourth impurity region of the second conductive type formed at an interval from the third impurity region in a top layer portion of the semiconductor layer; a second floating gate formed on the first insulating film and opposing a region between the third impurity region and the fourth impurity region; a third insulating film formed on the second floating gate; a second control gate formed on the third insulating film; a fifth impurity region of the second conductive type formed at an interval from the fourth impurity region in a top layer portion of the semiconductor layer; and a second select gate formed on the first insulating film and opposing a region between the fourth impurity region and the fifth impurity region.

The first impurity region, the second impurity region and the first select gate, opposing the region between the first impurity region and the second impurity region across the first insulating film, make up a first select transistor. The second impurity region, the third impurity region, the first floating gate, opposing the region between the second impurity region and the third impurity region across the first insulating film, and the first control gate, opposing the first floating gate across the second insulating film, make up a first memory transistor. The third impurity region, the fourth impurity region, the second floating gate, opposing the region between the third impurity region and the fourth impurity region across the first insulating film, and the second control gate, opposing the second floating gate across the third insulating film, make up a second memory transistor. The fourth impurity region, the fifth impurity region and the second select gate, opposing the region between the fourth impurity region and the fifth impurity region, make up the second select transistor.

When in a state where the first control gate and the second control gate are set to the ground potential, the programming voltage Vpp is applied to the first impurity region, the first select gate, the second select gate and the fifth impurity region, the first select transistor and the second select transistor turn on and high electric fields are formed between the second impurity region and the first floating gate and between the fourth impurity region and the second floating gate, respectively. Then, by the high electric fields, carriers are drawn from the first floating gate and the second floating gate into the second impurity region and the fourth impurity region respectively, and thereby writing of the same data into the first memory transistor and the second memory transistor is achieved.

There is no path through which leakage of current occurs during the writing of the data, and the programming voltage Vpp applied to the first impurity region and the fifth impurity region thus contributes efficiently to the drawing of carriers from the first floating gate and the second floating gate. Further, the same data can be written simultaneously into the first memory transistor and the second memory transistor, and the writing of data can thus be achieved in a shorter time than in an arrangement where the same data are written in tandem into the first memory transistor and the second memory transistor. Improvement of the data writing efficiency and reduction of the data writing time can thus be achieved.

Preferably, the EEPROM according to the other aspect further includes an element isolation portion formed selectively in the top surface of the semiconductor layer and surrounding an active region of rectangular shape in plan view. That is, preferably, the active region in which the first select transistor, the first memory transistor, the second select transistor and the second memory transistor are formed so as to have a rectangular view in plan view and be insulated from surroundings by the element isolation portion. Preferably in this case, the first impurity region, the second impurity region, the third impurity region, the fourth impurity region, and the fifth impurity region are formed so as to be aligned in that order from one end side to the other end side in a longitudinal direction of the active region. By adopting this layout, reduction of size of the active region can be promoted.

Preferably, in this case, the third impurity region is formed at a central portion in the longitudinal direction of the active region, the first impurity region and the fifth impurity region are formed at positions that are mutually symmetrical with respect to a center in the longitudinal direction of the active region, and the second impurity region and the fourth impurity region are formed at positions that are mutually symmetrical with respect to the center in the longitudinal direction of the active region. With this layout, respective spaces between the third impurity region and the second impurity region and between the third impurity region and the fourth impurity region (respective channel regions of the first memory transistor and the second memory transistor) are equal, and the size of the active region can thus be reduced in comparison to a case where one of the spaces is made larger than the others. Further, a space between the first impurity region and the second impurity region (channel region of the first select transistor) and a space between the fourth impurity region and the fifth impurity region (channel region of the second select transistor) are equal, and the size of the active region can thus be reduced in comparison to a case where one of the spaces is made larger than the other.

Further, the EEPROM further includes a first contact plug connected to a top surface of the first impurity region and a second contact plug connected to a top surface of the fifth impurity region, and does not require a contact plug connected to a top surface of the third impurity region. The size of the third impurity region can thus be reduced in comparison to the conventional EEPROM (see FIG. 9) and the size of the active region can thus be reduced.

The foregoing and other objects, features and effects of the present invention will become more apparent from the following detailed description of the embodiments with reference to the attached drawings.

DETAILED DESCRIPTION OF THE PREFERRED EMBODIMENTS

Figure 1:
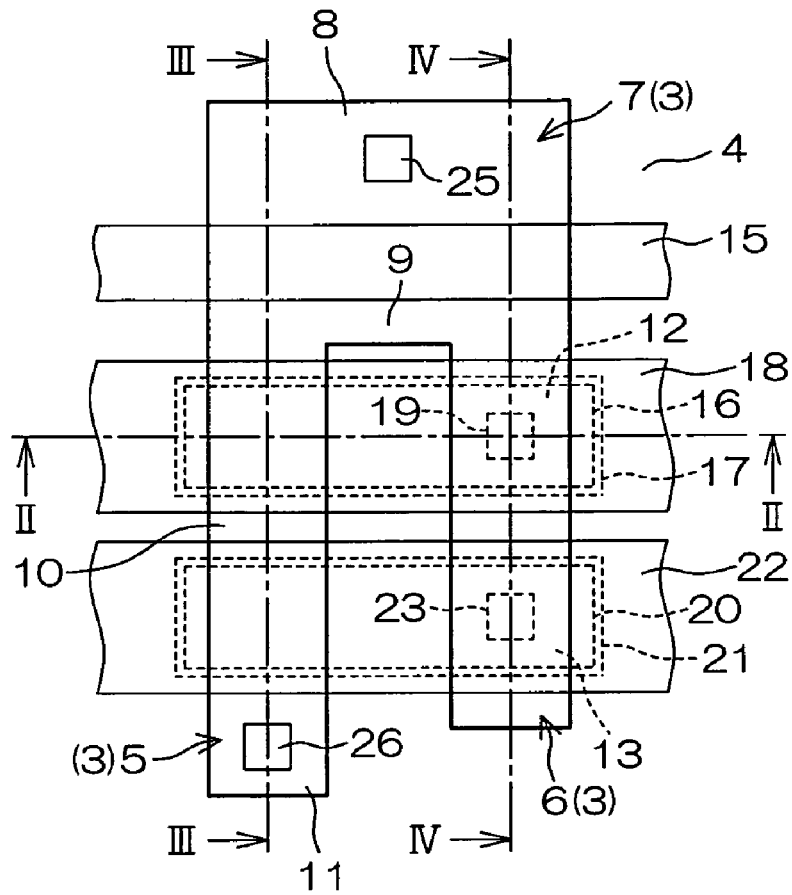
FIG. 1 is a schematic plan view of an EEPROM according to a first embodiment of the present invention.
Figure 2:
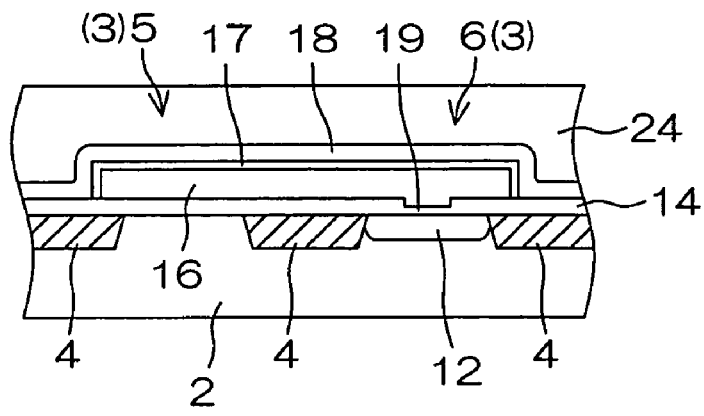
FIG. 2 is a schematic sectional view taken on cutting line II-II of the EEPROM shown in FIG. 1.
Figure 3:
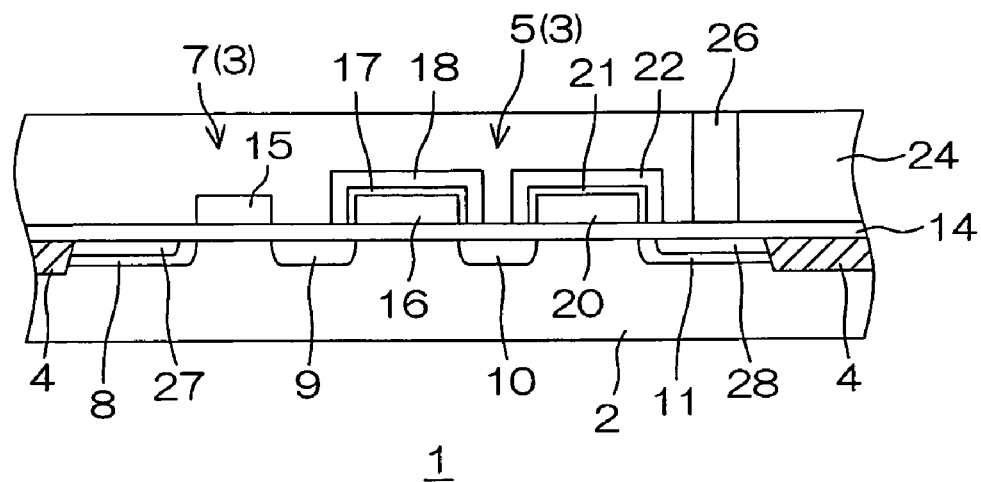
FIG. 3 is a schematic sectional view taken on cutting line III-III of the EEPROM shown in FIG. 1.
Figure 4:
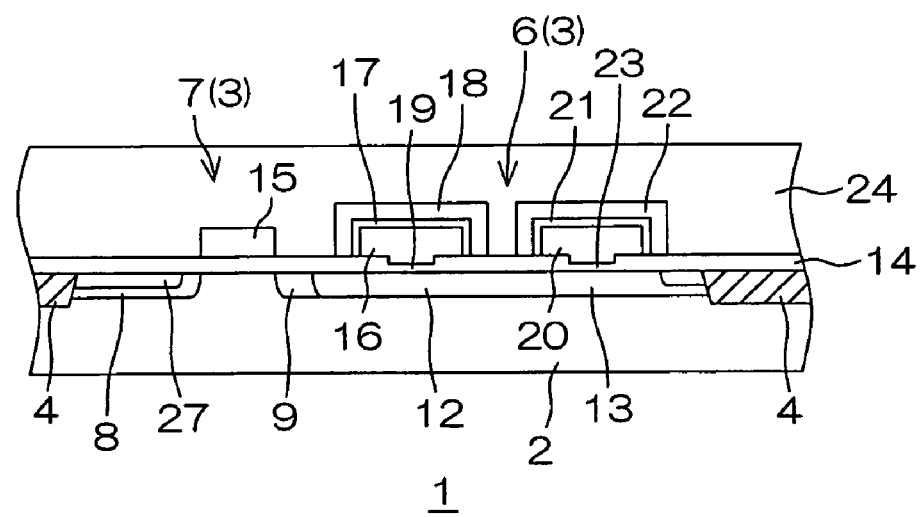
FIG. 4 is a schematic sectional view taken on cutting line IV-IV of the EEPROM shown in FIG. 1.

FIG. 1 is a schematic plan view of an EEPROM according to a first embodiment of the present invention. FIG. 2 is a schematic sectional view taken on cutting line II-II of the EEPROM shown in FIG. 1. FIG. 3 is a schematic sectional view taken on cutting line of the EEPROM shown in FIG. 1. FIG. 4 is a schematic sectional view taken on cutting line IV-IV of the EEPROM shown in FIG. 1.

As shown in FIGS. 2 to 4, the EEPROM 1 includes a P type semiconductor layer 2. The semiconductor layer 2 may be an Si (silicon) substrate or may be an Si layer formed by epitaxial growth or CVD (chemical vapor deposition).

In a top surface of the semiconductor layer 2, an element isolation portion 4 is formed at a portion excluding a plurality of active regions 3. The element isolation portion 4 may have, for example, a structure in which an insulator is embedded in a shallow trench formed by digging comparatively shallowly from the top surface of the semiconductor layer 2, or may be a silicon oxide film that is formed selectively on the top surface of the semiconductor layer 2 by a LOCOS (local oxidation of silicon) method. In addition, in the respective figures in which the element isolation portion 4 is illustrated, hatching is applied only to the element isolation portion 4 and hatching is not applied to other portions.

In FIG. 1, an outline of an active region 3 is indicated by thick lines. The plurality of active regions 3 are formed and aligned in a row direction and in a column direction orthogonal to the row direction. Each active region 3 has a first portion 5 extending in the column direction, a second portion 6 extending in the column direction and spaced from the first portion 5 across an interval in the row direction, and a third portion 7 connecting respective one ends in the column direction of the first portion 5 and the second portion 6.

In top layer portions of the semiconductor layer 2 in the third portion 7 of each active region 3, a first impurity region 8 and a second impurity region 9, each of an N type, are formed at an interval in the column direction as shown in FIGS. 3 and 4.

Further, in a top layer portion of the semiconductor layer 2 in the first portion 5 of the active region 3, an N type third impurity region 10 is formed at an interval in the column direction from the second impurity region 9. Still further, in a top layer portion of the semiconductor layer 2 at an end portion in the column direction of the first portion 5, an N type fourth impurity region 11 is formed at an interval in the column direction from the third impurity region 10.

Further, in a top layer portion of the semiconductor layer 2 in the second portion 6 of the active region 3, a fifth impurity region 12 and a sixth impurity region 13, each of an N type, are formed adjacent each other and made integral in the column direction. The fifth impurity region 12 and the sixth impurity region 13 that are integral are continuous in that order from the second impurity region 9.

The first impurity region 8, the second impurity region 9, the third impurity region 10 and the fourth impurity region 11 have substantially the same N type impurity concentration, and the fifth impurity region 12 and the sixth impurity region 13 have a higher N type impurity concentration than that of the first impurity region 8, the second impurity region 9, the third impurity region 10, and the fourth impurity region 11.

As shown in FIGS. 2 to 4, a first insulating film 14 is formed on the semiconductor layer 2. The first insulating film 14 is made, for example, of $SiO_2$.

As shown in FIGS. 3 and 4, on the first insulating film 14, a select gate 15, made of doped polysilicon (for example, a polysilicon doped with a high concentration of an N type impurity), is formed in a line-like manner extending in the row direction at a position opposing a region between the first impurity region 8 and the second impurity region 9.

Further, as shown in FIGS. 1 to 4, on the first insulating film 14, a first floating gate 16, made of doped polysilicon, is formed at a position opposing and spanning across the fifth impurity region 12 and a region between the second impurity region 9 and the third impurity region 10.

A second insulating film 17 is formed on the first floating gate 16. The second insulating film 17 has, for example, an ONO (oxide film-nitride film-oxide film) structure in which a silicon nitride film is sandwiched by a pair of silicon oxide films. The second insulating film 17 covers an upper surface and side surfaces of the first floating gate 16.

On the second insulating film 17, a first control gate 18, made of doped polysilicon, is formed in a line-like manner extending in the row direction. The first control gate 18 covers an upper surface and side surfaces of the second insulating film 17.

As shown in FIGS. 1, 2, and 4, a first tunnel window 19 is formed in the first insulating film 14 by decreasing a thickness of a part of a portion opposing the fifth impurity region 12.

Further, as shown in FIGS. 1, 3, and 4, on the first insulating film 14, a second floating gate 20, made of doped polysilicon, is formed at a position opposing and spanning across the sixth impurity region 13 and a region between the third impurity region 10 and the fourth impurity region 11.

A third insulating film 21 is formed on the second floating gate 20. The third insulating film 21 has, for example, the ONO structure in which a silicon nitride film is sandwiched by a pair of silicon oxide films. The third insulating film 21 covers an upper surface and side surfaces of the second floating gate 20.

On the third insulating film 21, a second control gate 22, made of doped polysilicon, is formed in a line-like manner extending in the row direction. The second control gate 22 covers an upper surface and side surfaces of the third insulating film 21.

As shown in FIGS. 1 and 4, a second tunnel window 23 is formed in the first insulating film 14 by decreasing a thickness of a part of a portion opposing the sixth impurity region 13. For example, whereas the first insulating film 14 has a thickness of 200 to 400 Å, the first tunnel window 19 and the second tunnel window 23 are formed to a thickness of 70 to 100 Å.

As shown in FIGS. 2 to 4, an interlayer insulating film 24 is laminated on the semiconductor layer 2. The interlayer insulating film 24 is made, for example, of $SiO_2$. The first insulating film 14, the select gate 15, the first control gate 18, and the second control gate 22 are covered all together by the interlayer insulating film 24.

A plurality of wirings (not shown) are formed on the interlayer insulating film 24, and contact plugs 25 and 26 for connecting the wirings with the first impurity region 8 and the fourth impurity region 11 respectively, are embedded in the interlayer insulating film 24 as shown in FIGS. 1 and 3. The contact plugs 25 and 26 are made, for example, of W (tungsten). In a top layer portion of the first impurity region 8, a contact region 27, having a higher N type impurity concentration than other portions, is formed at a portion connected to the contact plug 25. Further, in a top layer portion of the fourth impurity region 11, a contact region 28, having a higher N type impurity concentration than other portions, is formed at a portion connected to the contact plug 26.

The first impurity region 8, the second impurity region 9, and the select gate 15 opposing the region between the first impurity region 8 and the second impurity region 9 across the first insulating film 14 make up a select transistor. The second impurity region 9, the third impurity region 10, the fifth impurity region 12, the first floating gate 16 opposing the fifth impurity region 12 and the region between the second impurity region 9 and the third impurity region 10 across the first insulating film 14, the second insulating film 17, and the first control gate 18 make up a first memory transistor. The third impurity region 10, the fourth impurity region 11, the second floating gate 20 opposing the sixth impurity region 13 and the region between the third impurity region 10 and the fourth impurity region 11 across the first insulating film 14, the third insulating film 21, and the second control gate 22 make up a second memory transistor.

When in a state where the first control gate 18 and the second control gate 22 are set to a ground potential and the fourth impurity region 11 (the wiring connected to the contact plug 26) is set to an open state, when a programming voltage Vpp (for example, 15 to 20V) is applied to the first impurity region 8 (the wiring connected to the contact plug 25) and the select gate 15, the select transistor turns on and high electric fields are formed respectively between the fifth impurity region 12 and the first floating gate 16 and between the sixth impurity region 13 and the second floating gate 20. Then, by the high electric fields, electrons are drawn from the first floating gate 16 and the second floating gate 20 into the fifth impurity region 12 and the sixth impurity region 13 respectively, and thereby writing of data into the first and second memory transistors is achieved.

Thus, with the EEPROM 1, the same data can be written into the first and second memory transistors simultaneously. Thus, unlike in an arrangement in which the same data are written individually into two memory transistors, the same data can be written reliably into the two memory transistors (the first and second memory transistors).

When data are to be deleted, the first impurity region 8 (the wiring connected to the contact plug 25) and the fourth impurity region 11 (the wiring connected to the contact plug 26) are set to the ground potential. Then, the programming voltage Vpp is applied to the select gate 15, the first control gate 18 and the second control gate 22. Electrons thus flow into the second impurity region 9, the fifth impurity region 12 and the sixth impurity region 13. As a result, high electric fields are formed respectively between the fifth impurity region 12 and the first floating gate 16 and between the sixth impurity region 13 and the second floating gate 20, and electrons are FN tunneled through the first tunnel window 19 and the second tunnel window 23 and implanted from the fifth impurity region 12 and the sixth impurity region 13 into the first floating gate 16 and the second floating gate 20 respectively.

Threshold voltages of the respective memory transistors (voltages necessary for turning on the respective memory transistors) differ between a state in which electrons are accumulated in the first floating gate 16 and the second floating gate 20 and a state in which electrons are not accumulated. That is, in the state in which electrons are accumulated in the first floating gate 16 and the second floating gate 20, each threshold voltage is a relatively high voltage Vth(1), and in the state in which electrons are not accumulated in the first floating gate 16 and the second floating gate 20, each threshold voltage is a relatively low voltage Vth(0).

When data are to be read from the memory transistors, a predetermined voltage Vcc is applied to the first impurity region 8 (the wiring connected to the contact plug 25) and the select gate 15. In addition, the fourth impurity region 11 (the wiring connected to the contact plug 26) is set to the ground potential. Then, a sense voltage Vsense of a value intermediate the voltage Vth(1) and the voltage Vth(0) is applied to the first control gate 18 and the second control gate 22. If a current flows through each memory transistor by the application of the sense voltage Vsense, for example, a logic signal "1" can be obtained. Meanwhile, if a current does not flow through each memory transistor by the application of the sense voltage Vsense, for example, a logic signal "0" can be obtained.

FIGS. 5A to 5I and 6A to 6I are schematic sectional view successively showing a manufacturing process of the EEPROM shown in FIGS. 1 to 4. The cutting line of FIGS. 5A to 5I is the same as the cutting line of FIG. 3 (the cutting line III-III shown in FIG. 1), and the cutting line of FIGS. 6A to 6I is the same as the cutting line of FIG. 4 (the cutting line IV-IV shown in FIG. 1).

Figure 5A:
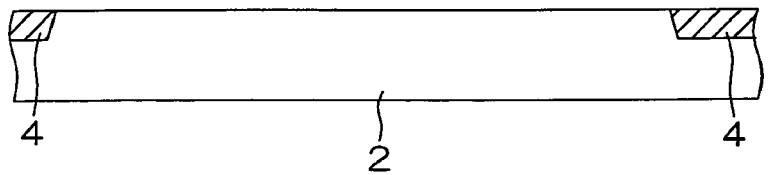
FIGS. 5A to 5I and 6A to 6I are schematic sectional view successively showing a manufacturing process of the EEPROM shown in FIGS. 1 to 4.
Figure 6A:
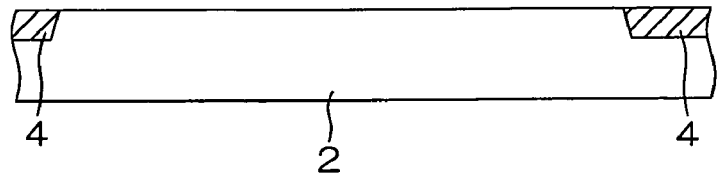

In the manufacturing process of the EEPROM 1, first, the element isolation portion 4 is formed selectively in the top surface of the semiconductor layer 2 as shown in FIGS. 5A and 6A.

Figure 5B:
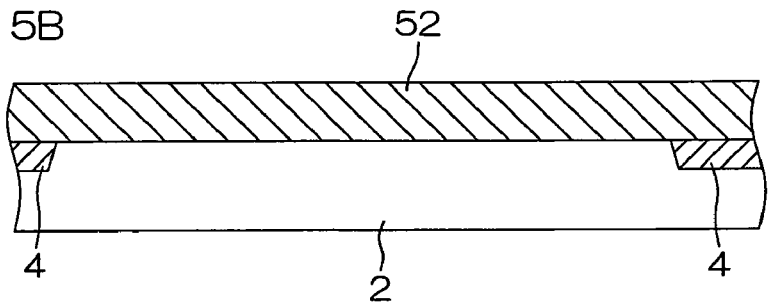
Figure 6B:
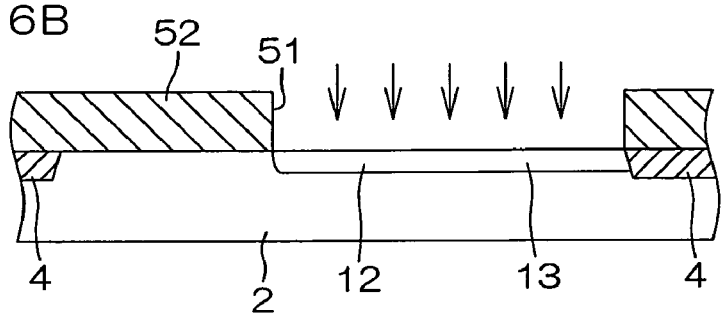

Next, as shown in FIGS. 5B and 6B, a resist pattern 52, having an opening 51 at a portion opposing a portion where the fifth impurity region 12 and the sixth impurity region 13 are to be formed, is formed on the semiconductor layer 2 by photolithography. Then, by ion implantation, the N type impurity (for example, P (phosphorus) or As (arsenic)) is implanted into a top layer portion of the semiconductor layer 2 through the opening 51 using the resist pattern 52 as a mask. The fifth impurity region 12 and the sixth impurity region 13 are thereby formed in the top layer portion of the semiconductor layer 2. After the ion implantation process, the resist pattern 52 is removed.

Figure 5C:
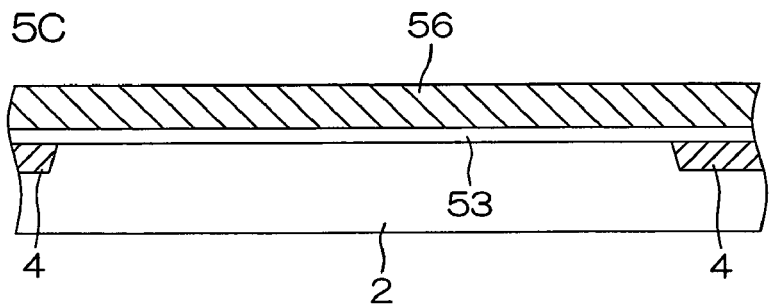
Figure 6C:
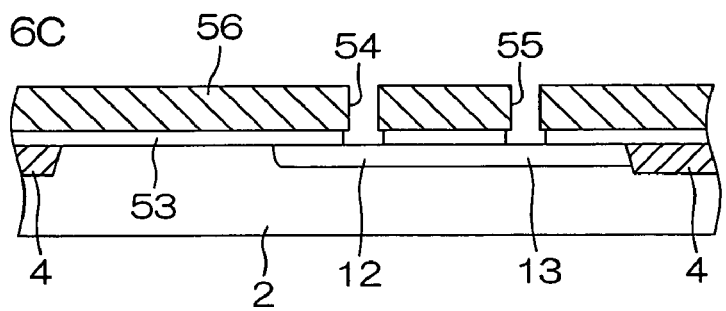

Thereafter, as shown in FIGS. 5C and 6C, a silicon oxide film 53 is formed on the top surface of the semiconductor layer 2 by a thermal oxidation method. Next, a resist pattern 56, having openings 54 and 55 at portions opposing portions where the first tunnel window 19 and the second tunnel window 23 are to be formed respectively, is formed on the silicon oxide film 53 by photolithography. The portions of the silicon oxide film 53 that are exposed from the openings 54 and 55 are then removed by etching using the resist pattern 56 as a mask. The top surface of the semiconductor layer 2 is thereby exposed selectively. As the method for removing the silicon oxide film 53, not dry etching, but wet etching, is adopted to prevent damaging the semiconductor layer 2. After the etching, the resist pattern 56 is removed.

Figure 5D:
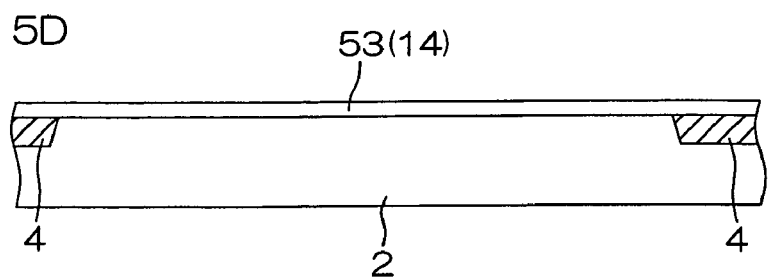
Figure 6D:
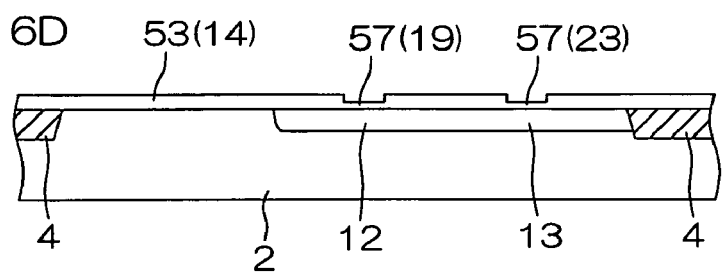

Next, in reference to FIGS. 5D and 6D, at the portions where the top surface of the semiconductor layer 2 is exposed, a silicon oxide film 57 is formed by the thermal oxidation method so as to be integral to the silicon oxide film 53 that is formed beforehand on the top surface of the semiconductor layer 2. With the forming of the silicon oxide film 57, the silicon oxide film 53 increases in thickness (grows further), and the silicon oxide film 57 is thus smaller in thickness than the silicon oxide film 53. The silicon oxide film 57 thus makes up the first tunnel window 19 and the second tunnel window 23, and the first insulating film 14, having the first tunnel window 19 and the second tunnel window 23, is obtained on the semiconductor layer 2.

Figure 5E:
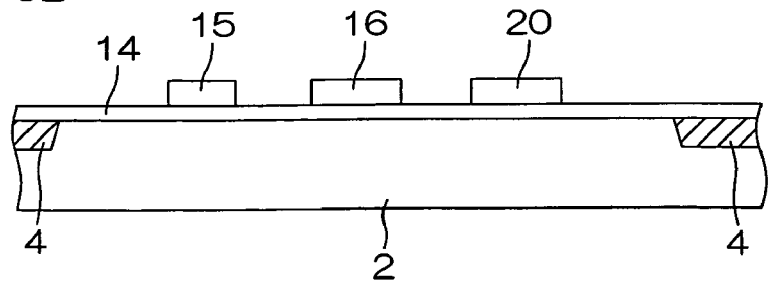
Figure 6E:
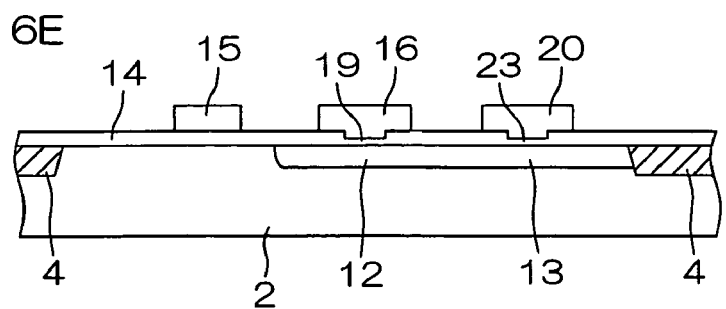

Thereafter, a polysilicon layer is formed on the first insulating film 14 by LPCVD (low pressure chemical vapor deposition). The N type impurity is then implanted into the polysilicon layer by ion implantation. The polysilicon layer (doped polysilicon layer) with the N type impurity implanted therein is then patterned by photolithography and etching. As shown in FIGS. 5E and 6E, the select gate 15, the first floating gate 16 and the second floating gate 20 are thereby formed on the first insulating film 14.

Figure 5F:
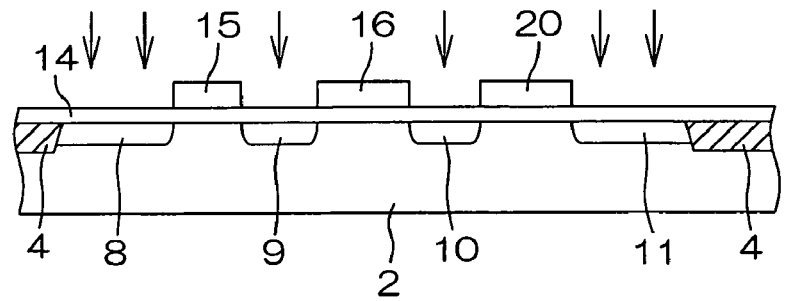
Figure 6F:
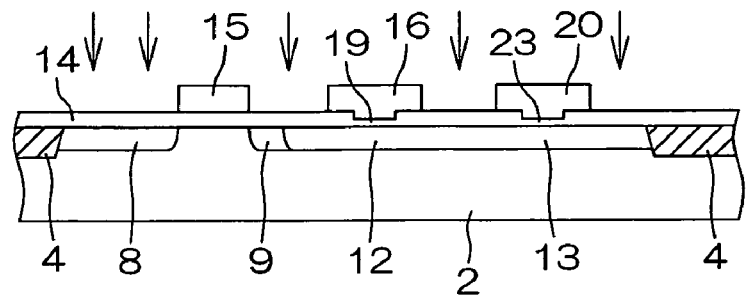

Next, by ion implantation, the N type impurity is implanted into top layer portions of the semiconductor layer 2 using the select gate 15, the first floating gate 16 and the second floating gate 20 as masks as shown in FIGS. 5F and 6F. The first impurity region 8, the second impurity region 9, the third impurity region 10 and the fourth impurity region 11 are thereby formed in the top layer portions of the semiconductor layer 2 in a self-aligning manner with respect to the select gate 15, the first floating gate 16 and the second floating gate 20. Further, by the N type impurity being implanted further into the fifth impurity region 12 and the sixth impurity region 13, the N type impurity concentrations in the fifth impurity region 12 and the sixth impurity region 13 are increased.

Figure 5G:
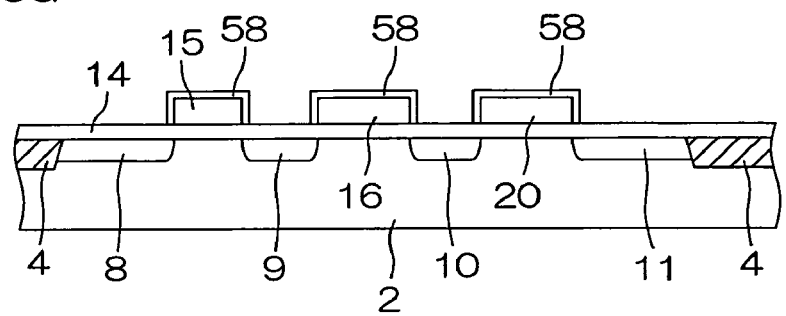
Figure 6G:
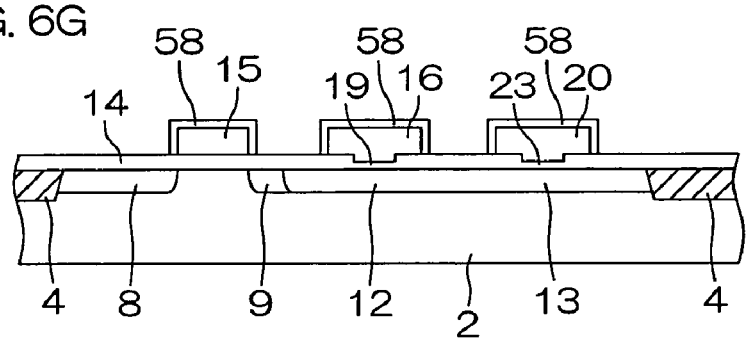

Next, by CVD, an ONO film 58, having the ONO structure, is formed so as to cover the respective top surfaces of the first insulating film 14, the select gate 15, the first floating gate 16 and the second floating gate 20 all together. Thereafter, as shown in FIGS. 5G and 6G, the ONO film 58 is removed from the top surface of the first insulating film 14 and is left on the respective top surfaces of the select gate 15, the first floating gate 16 and the second floating gate 20. The selective removal of the ONO film 58 is achieved by photolithography and etching.

Figure 5H:
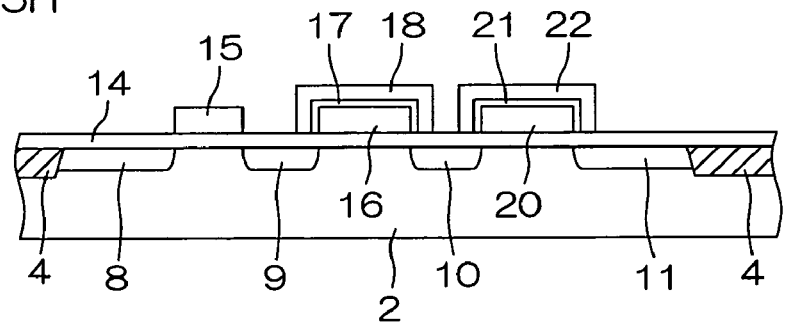
Figure 6H:
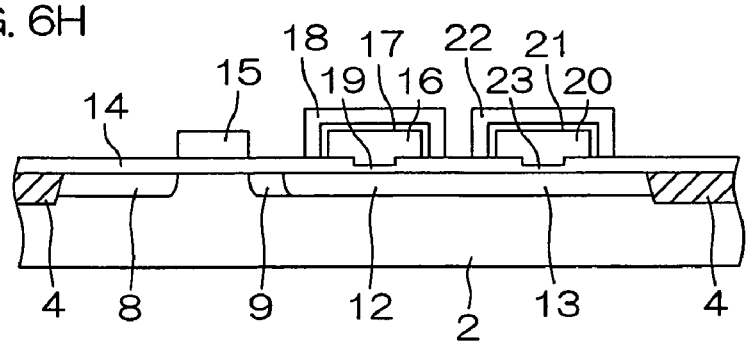

Then, by LPCVD, a doped polysilicon layer is formed on the first insulating film 14 and the ONO film 58. The doped polysilicon layer is then removed from the top surface of the semiconductor layer 2 and the portion of the ONO film 58 covering the select gate 15. In this process, the portion of the ONO film 58 covering the select gate 15 is removed as well. The first control gate 18 and the second control gate 22 are thereby formed as shown in FIGS. 5H and 6H. Further, the ONO films 58 left on the first floating gate 16 and the second floating gate 20 become the second insulating film 17 and the third insulating film 21 respectively. The selective removal of the doped polysilicon layer and the ONO film 58 is achieved by photolithography and etching.

Figure 5I:
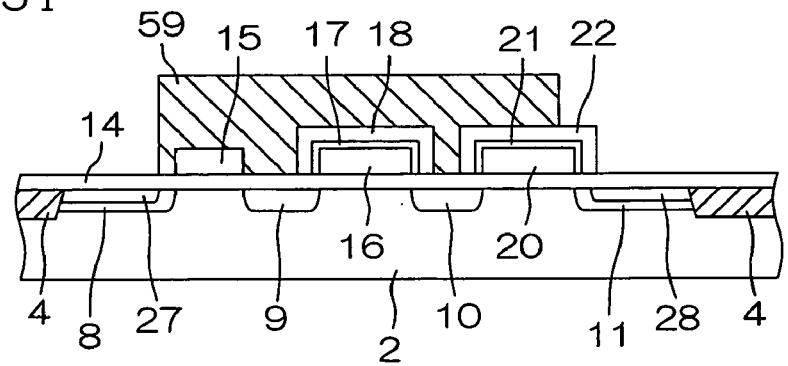
Figure 6I:
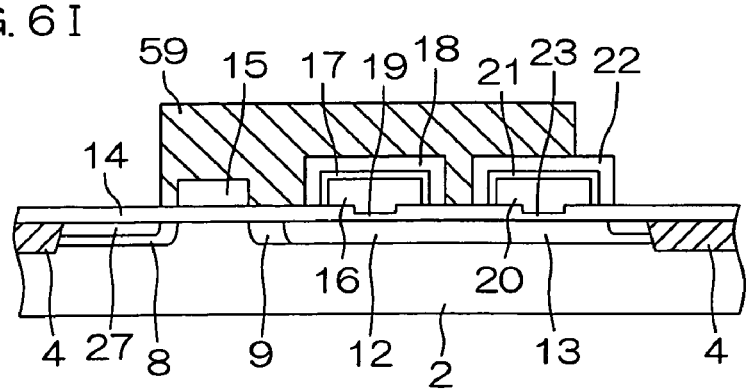

Thereafter, as shown in FIGS. 5I and 6I, a resist pattern 59 is formed on the semiconductor layer 2 by photolithography. Then, by ion implantation, the N type impurity is implanted into top layer portions of the semiconductor layer 2 using the resist pattern 59 as a mask. The contact regions 27 and 28 are thereby formed in the top layer portions of the semiconductor layer 2. After the ion implantation process, the resist pattern 59 is removed.

The interlayer insulating film 24, the contact plugs 25 and 26, etc., are then formed on the semiconductor layer 2, and the EEPROM 1 shown in FIGS. 1 to 4 is thereby obtained.

Figure 7:
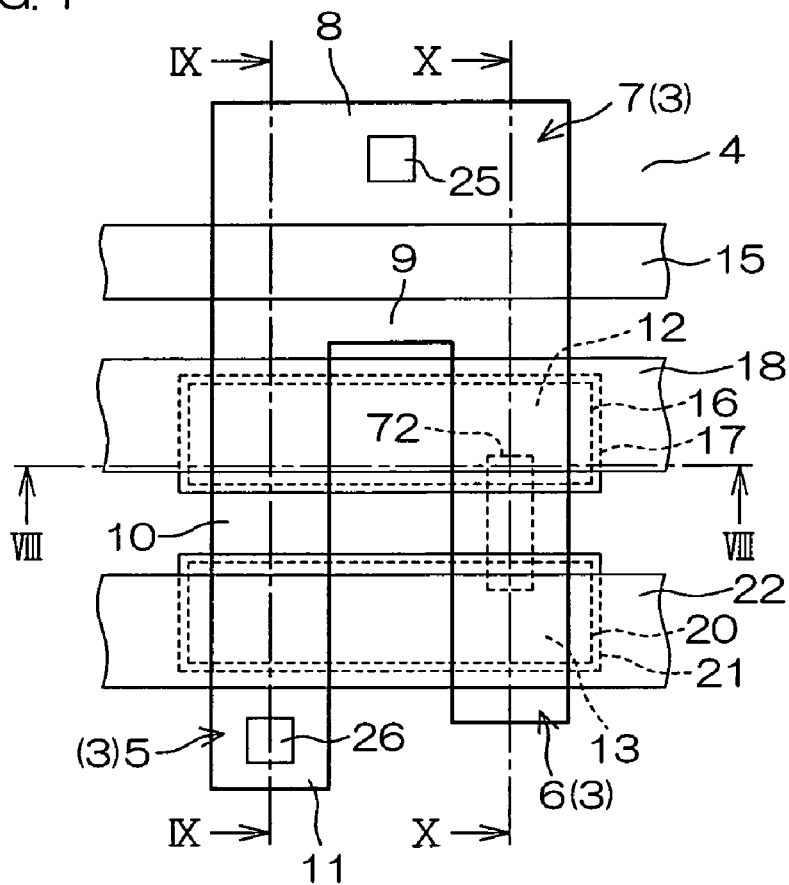
FIG. 7 is a schematic plan view of an EEPROM according to a second embodiment of the present invention.
Figure 8:
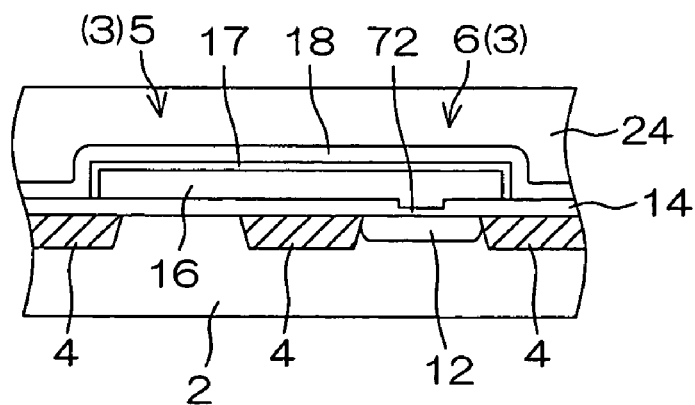
FIG. 8 is a schematic sectional view taken on cutting line VIII-VIII of the EEPROM shown in FIG. 7.
Figure 9:
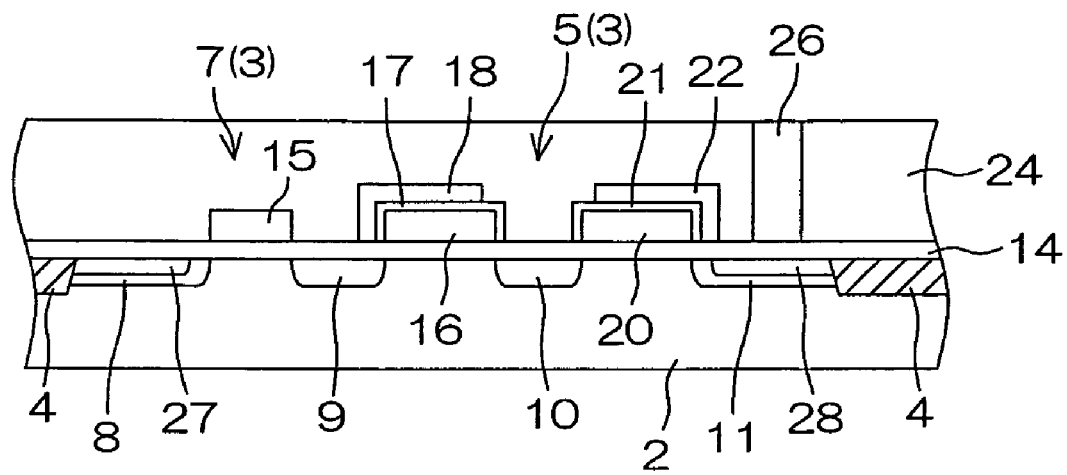
FIG. 9 is a schematic sectional view taken on cutting line IX-IX of the EEPROM shown in FIG. 7.
Figure 10:
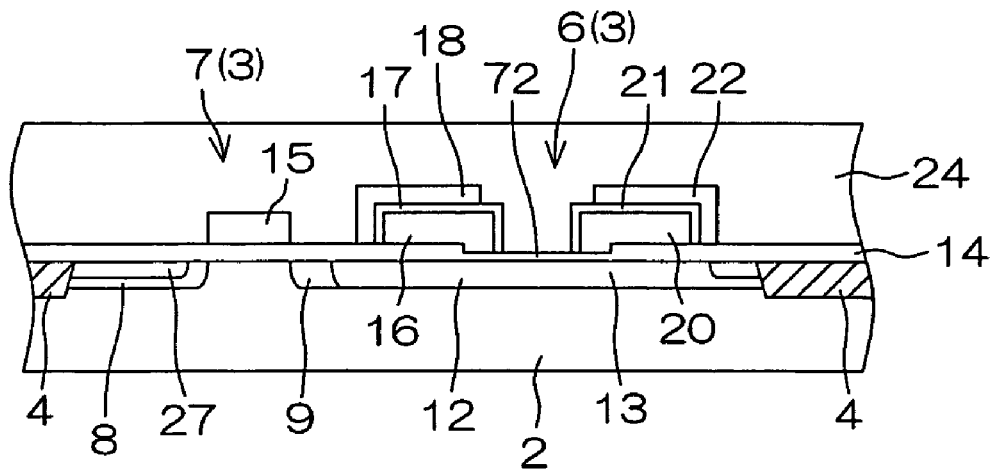
FIG. 10 is a schematic sectional view taken on cutting line X-X of the EEPROM shown in FIG. 7.

FIG. 7 is a schematic plan view of an EEPROM according to a second embodiment of the present invention. FIG. 8 is a schematic sectional view taken on cutting line VIII-VIII of the EEPROM shown in FIG. 7. FIG. 9 is a schematic sectional view taken on cutting line IX-IX of the EEPROM shown in FIG. 7. FIG. 10 is a schematic sectional view taken on cutting line X-X of the EEPROM shown in FIG. 7. In the respective figures of FIGS. 7 to 10, portions corresponding to the respective portions shown in FIGS. 1 to 4 are provided with the same reference symbols as the reference symbols provided to the respective portions. In the description that follows, only differences of the structure shown in FIGS. 7 to 10 with respect to the structure shown in FIGS. 1 to 4 shall be taken up and described, and description of the respective portions provided with the same reference symbols shall be omitted.

With the EEPROM 71 shown in FIGS. 7 to 10, in addition to the respective portions corresponding to the first tunnel window 19 and the second tunnel window 23 shown in FIG. 1, the thickness of the first insulating film 14 is decreased at a portion between the respective portions so as to form a single tunnel window 72 that includes the first tunnel window 19 and the second tunnel window 23. Put in another way, the tunnel window 72 is formed in a manner such that the first tunnel window 19 and the second tunnel window 23 shown in FIG. 1 are respectively elongated in the opposing directions and are made adjacent and integral in the column direction.

Further, the first control gate 18 and the second control gate 22 do not cover the side surfaces of the second insulating film 17 and the third insulating film 21 that oppose each other in the column direction respectively. That is, the first control gate 18 and the second control gate 22 cover the upper surfaces and the respective side surfaces of the second insulating film 17 and the third insulating film 21 that do not oppose each other in the column direction respectively.

FIGS. 11A to 11I and 12A to 12I are schematic sectional view successively showing a manufacturing process of the EEPROM shown in FIGS. 7 to 10. The cutting line of FIGS. 11A to 11I is the same as the cutting line of FIG. 9 (the cutting line IX-IX shown in FIG. 7), and the cutting line of FIGS. 12A to 12I is the same as the cutting line of FIG. 10 (the cutting line X-X shown in FIG. 7).

Figure 11A:
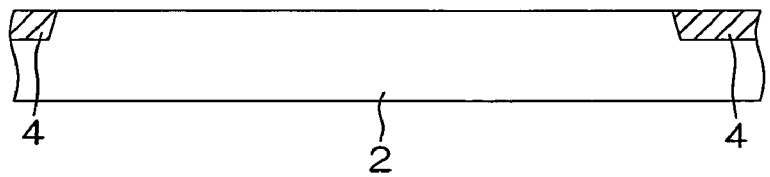
FIGS. 11A to 11I and 12A to 12I are schematic sectional view successively showing a manufacturing process of the EEPROM shown in FIGS. 7 to 10.
Figure 12A:
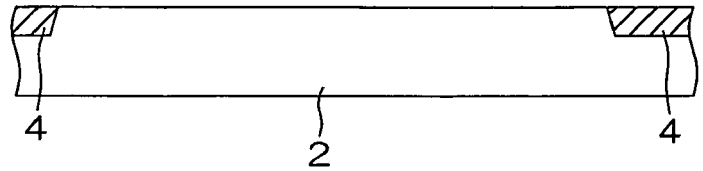

In the manufacturing process of the EEPROM 71, first, the element isolation portion 4 is formed selectively in the top surface of the semiconductor layer 2 as shown in FIGS. 11A and 12A.

Figure 11B:
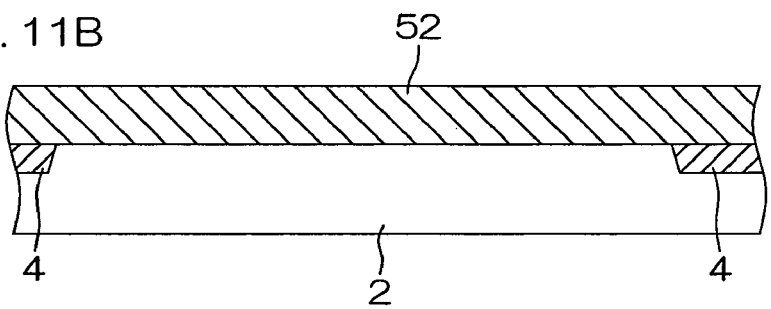
Figure 12B:
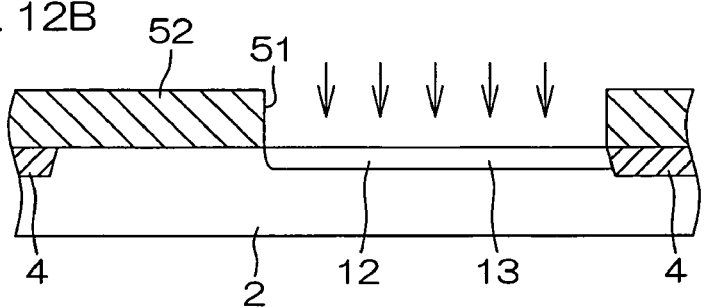

Next, as shown in FIGS. 11B and 12B, the resist pattern 52, having the opening 51 at the portion opposing the portion where the fifth impurity region 12 and the sixth impurity region 13 are to be formed, is formed on the semiconductor layer 2 by photolithography. Then, by ion implantation, the N type impurity is implanted into a top layer portion of the semiconductor layer 2 from the opening 51 using the resist pattern 52 as a mask. The fifth impurity region 12 and the sixth impurity region 13 are thereby formed in the top layer portion of the semiconductor layer 2. After the ion implantation process, the resist pattern 52 is removed.

Figure 11C:
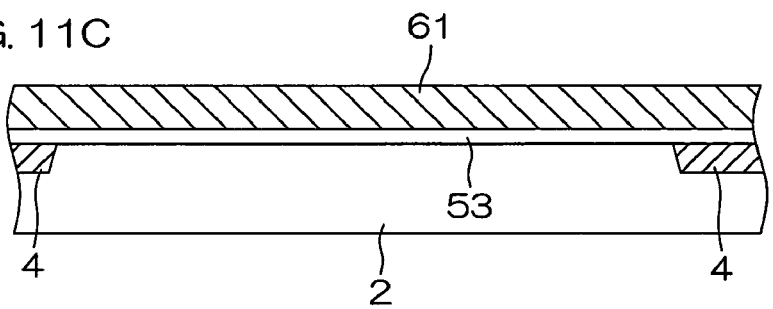
Figure 12C:
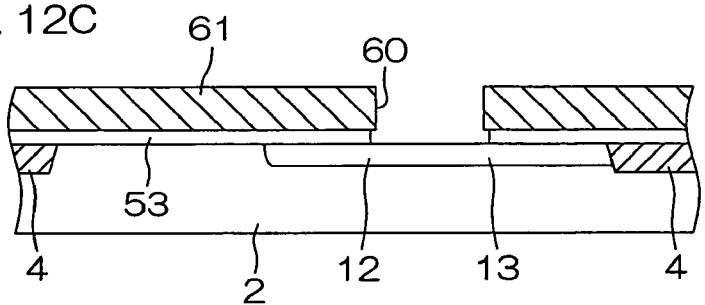

Thereafter, as shown in FIGS. 11C and 12C, the silicon oxide film 53 is formed on the top surface of the semiconductor layer 2 by the thermal oxidation method. Next, a resist pattern 61, having an opening 60 at a portion opposing a portion where the tunnel window 72 is to be formed, is formed on the silicon oxide film 53 by photolithography. The portion of the silicon oxide film 53 that is exposed from the opening 60 is then removed by etching using the resist pattern 61 as a mask. The top surface of the semiconductor layer 2 is thereby exposed selectively. As the method for removing the silicon oxide film 53, not dry etching, but wet etching, is adopted to prevent damaging the semiconductor layer 2. After the etching, the resist pattern 61 is removed.

Figure 11D:
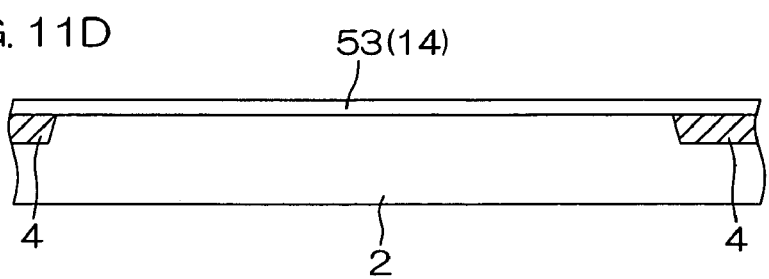
Figure 12D:
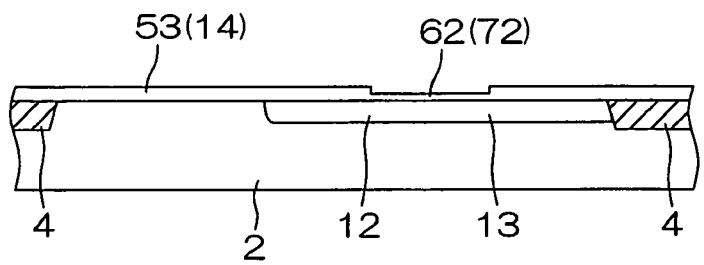

Next, in reference to FIGS. 11D and 12D, at the portions where the top surface of the semiconductor layer 2 is exposed, a silicon oxide film 62 is formed by the thermal oxidation method so as to be integral to the silicon oxide film 53 that is formed beforehand on the top surface of the semiconductor layer 2. With the forming of the silicon oxide film 62, the silicon oxide film 53 increases in thickness (grows further), and the silicon oxide film 62 is thus smaller in thickness than the silicon oxide film 53. The silicon oxide film 62 thus makes up the tunnel window 72, and the first insulating film 14, having the tunnel window 72, is obtained on the semiconductor layer 2.

Figure 11E:
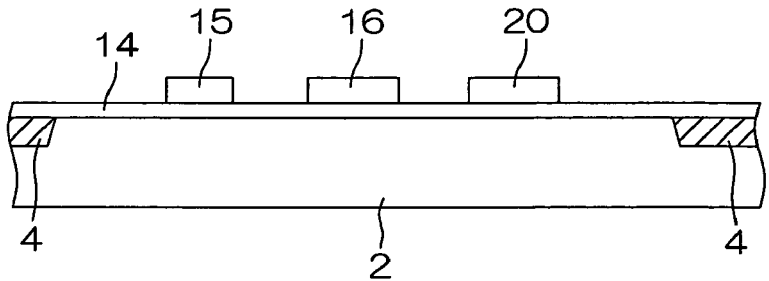
Figure 12E:
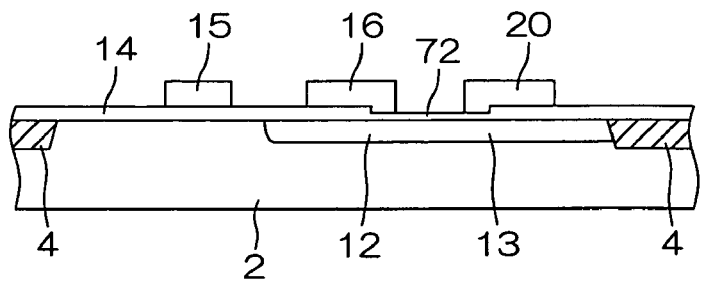

Thereafter, a polysilicon layer is formed on the first insulating film 14 by LPCVD. The N type impurity is then implanted into the polysilicon layer by ion implantation. The polysilicon layer (doped polysilicon layer) with the N type impurity implanted therein is then patterned by photolithography and etching. As shown in FIGS. 11E and 12E, the select gate 15, the first floating gate 16 and the second floating gate 20 are thereby formed on the first insulating film 14.

Figure 11F:
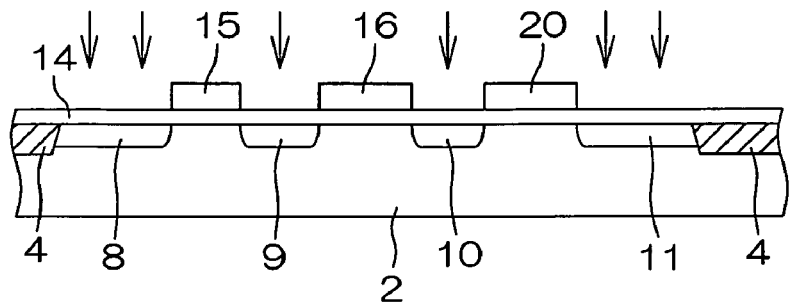
Figure 12F:
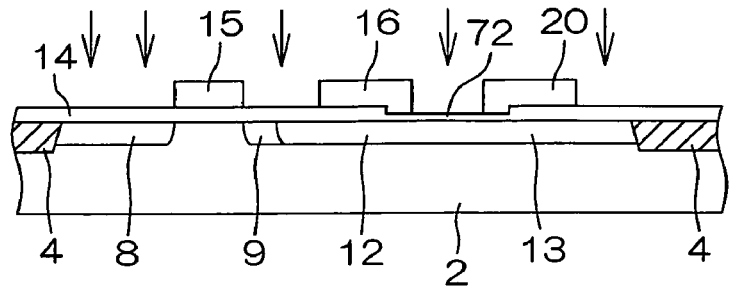

Next, by ion implantation, the N type impurity is implanted into top layer portions of the semiconductor layer 2 using the select gate 15, the first floating gate 16 and the second floating gate 20 as masks as shown in FIGS. 11F and 12F. The first impurity region 8, the second impurity region 9, the third impurity region 10 and the fourth impurity region 11 are thereby formed in the top layer portions of the semiconductor layer 2 in a self-aligning manner with respect to the select gate 15, the first floating gate 16 and the second floating gate 20. Further, by the N type impurity being implanted further into the fifth impurity region 12 and the sixth impurity region 13, the N type impurity concentrations in the fifth impurity region 12 and the sixth impurity region 13 are increased.

Figure 11G:
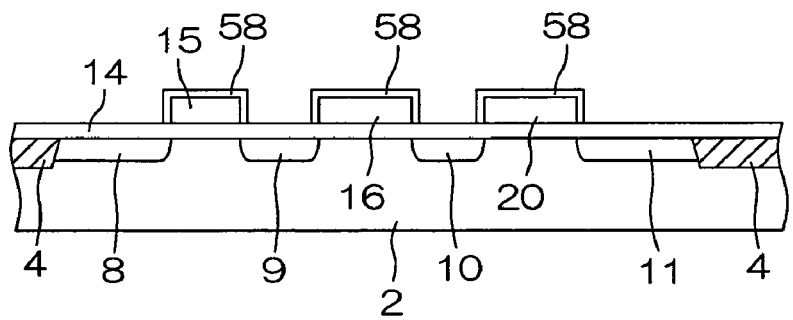
Figure 12G:
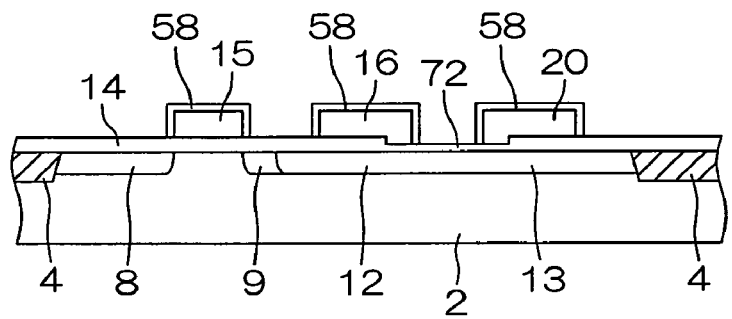

Next, by CVD, the ONO film 58, having the ONO structure, is formed so as to cover the respective top surfaces of the first insulating film 14, the select gate 15, the first floating gate 16 and the second floating gate 20 all together. Thereafter, as shown in FIGS. 11G and 12G, the ONO film 58 is removed from the top surface of the first insulating film 14 and is left on the respective top surfaces of the select gate 15, the first floating gate 16 and the second floating gate 20. The selective removal of the ONO film 58 is achieved by photolithography and etching.

Figure 11H:
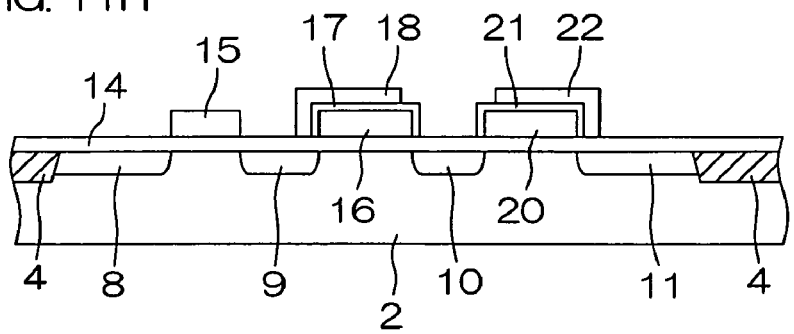
Figure 11:
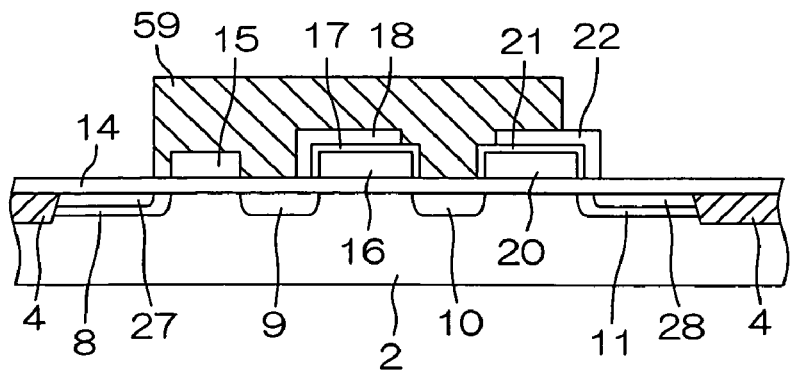
Figure 12H:
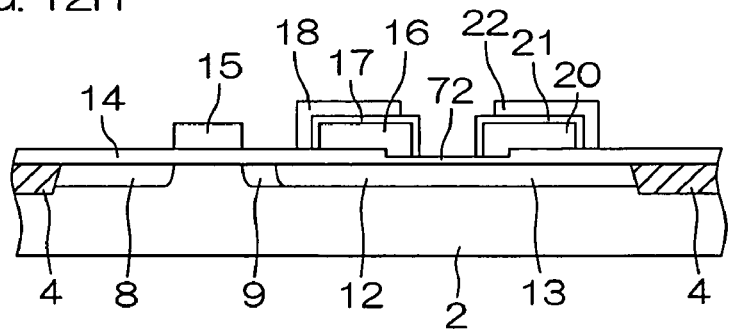

Then, by LPCVD, a doped polysilicon layer is formed on the first insulating film 14 and the ONO film 58. The doped polysilicon layer is then removed selectively. Further, the portion of the ONO film 58 covering the select gate 15 is removed. The first control gate 18 and the second control gate 22 are thereby formed as shown in FIGS. 11H and 12H. Further, the ONO films 58 left on the first floating gate 16 and the second floating gate 20 become the second insulating film 17 and the third insulating film 21 respectively. The selective removal of the doped polysilicon layer and the ONO film 58 is achieved by photolithography and etching.

Figure 12I:
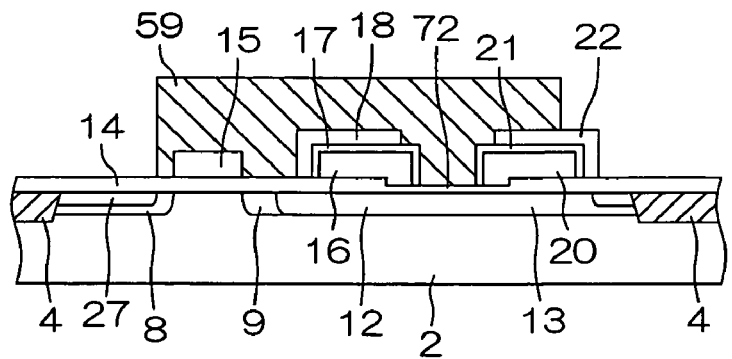

Thereafter, as shown in FIGS. 11I and 12I, the resist pattern 59 is formed on the semiconductor layer 2 by photolithography. Then, by ion implantation, the N type impurity is implanted into top layer portions of the semiconductor layer 2 using the resist pattern 59 as a mask. The contact regions 27 and 28 are thereby formed in the top layer portions of the semiconductor layer 2. After the ion implantation, the resist pattern 59 is removed.

The interlayer insulating film 24, the contact plugs 25 and 26, etc., are then formed on the semiconductor layer 2, and the EEPROM 71 shown in FIGS. 7 to 10 is thereby obtained.

The tunnel window 72 is larger than the first tunnel window 19 and the second tunnel window 23, and the formation thereof thus does not require fine patterning of the silicon oxide film 53. Then, by making respective portions of the tunnel window 72 that overlap with the first floating gate 16 and the second floating gate 20 have the minimum necessary sizes, the sizes of the memory cells (active region 3) can be reduced while making fine patterning of the silicon oxide film 53 unnecessary.

Figure 13:
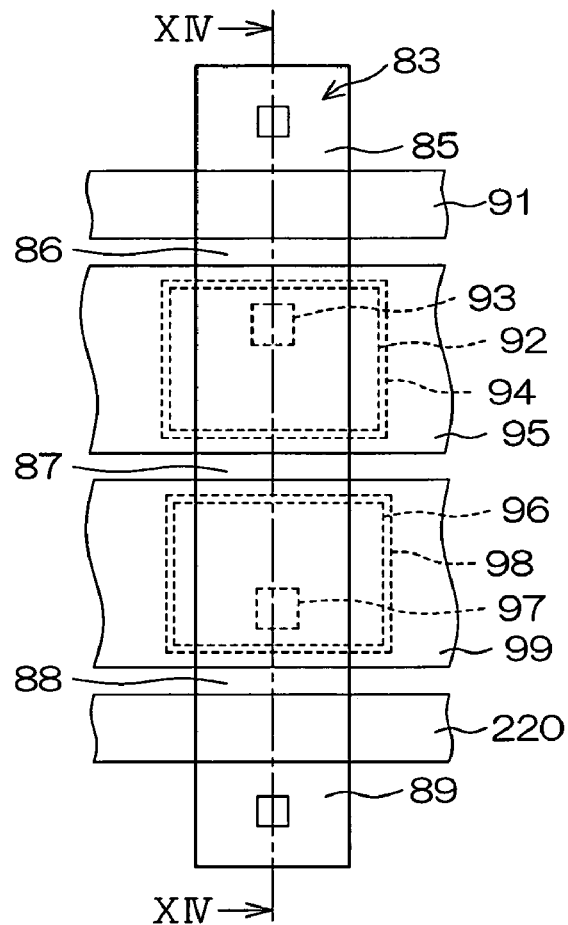
FIG. 13 is a schematic plan view of an EEPROM according to a third embodiment of the present invention.
Figure 14:
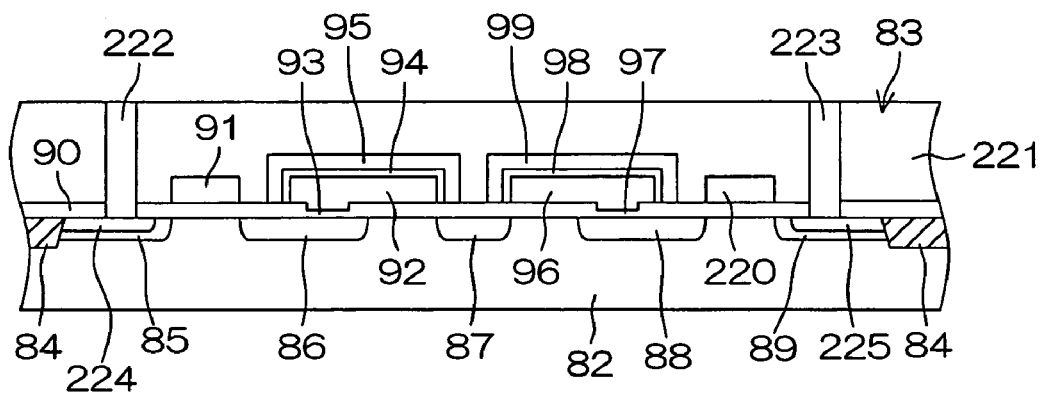
FIG. 14 is a schematic sectional view taken on cutting line XIV-XIV of the EEPROM shown in FIG. 13.
Figure 15:
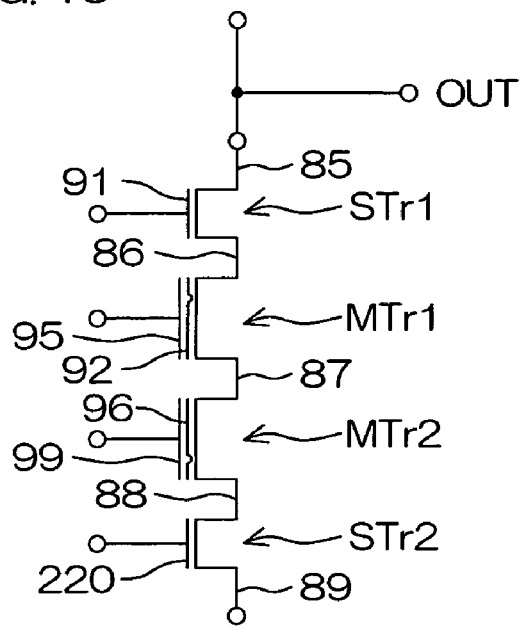
FIG. 15 is a circuit diagram of the EEPROM shown in FIG. 13.

FIG. 13 is a schematic plan view of an EEPROM according to a third embodiment of the present invention. FIG. 14 is a schematic sectional view taken on cutting line XIV-XIV of the EEPROM shown in FIG. 13. FIG. 15 is a circuit diagram of the EEPROM shown in FIG. 13.

As shown in FIG. 14, the EEPROM 81 includes a P type semiconductor layer 82. The semiconductor layer 82 may be an Si substrate or may be an Si layer formed by epitaxial growth or CVD.

In a top surface of the semiconductor layer 82, an element isolation portion 84 is formed at a portion excluding an active region 83 of rectangular shape in plan view. In FIG. 13, an outline of the active region 83 is indicated by thick lines. The element isolation portion 84 may have, for example, a structure in which an insulator is embedded in a shallow trench, formed by digging comparatively shallowly from the top surface of the semiconductor layer 82, or may be a silicon oxide film that is formed selectively on the top surface of the semiconductor layer 82 by the LOCOS method. In addition, in FIG. 14, hatching, which expresses a cross section, is applied only to the element isolation portion 84.

In top layer portions of the semiconductor layer 82 in the active region 83, five N type impurity regions 85 to 89 (first impurity region 85, second impurity region 86, third impurity region 87, fourth impurity region 88, and fifth impurity region 89) are formed and aligned at intervals in a longitudinal direction of the active regions 83. More specifically, the third impurity region 87 is formed in a central portion in the longitudinal direction of the active region 83, the first impurity region 85 and the fifth impurity region 89 are formed at positions that are mutually symmetrical with respect to a center in the longitudinal direction of the active region 83, and the second impurity region 86 and the fourth impurity region 88 are formed at positions that are mutually symmetrical with respect to the center in the longitudinal direction of the active region 83.

As shown in FIG. 14, a first insulating film 90 is formed on the semiconductor layer 82. The first insulating film 90 is made, for example, of $SiO_2$.

As shown in FIGS. 13 and 14, on the first insulating film 90, a first select gate 91, made of doped polysilicon (for example, a polysilicon doped with a high concentration of an N type impurity), is formed in a line-like manner extending in a direction (hereinafter referred to simply as "orthogonal direction") orthogonal to the longitudinal direction of the active region 83 at a position opposing a region between the first impurity region 85 and the second impurity region 86.

Further, on the first insulating film 90, a first floating gate 92, made of doped polysilicon, is formed at a position opposing a region between the second impurity region 86 and the third impurity region 87 so as to span across the active region 83 in the orthogonal direction.

A portion of the first floating gate 92 opposes the second impurity region 86 across the first insulating film 90. In the first insulating film 90, a first tunnel window 93 is formed by decreasing a thickness of a part of a portion sandwiched between the second impurity region 86 and the first floating gate 92.

A second insulating film 94 is formed on the first floating gate 92. The second insulating film 94 has, for example, the ONO (oxide film-nitride film-oxide film) structure in which a silicon nitride film is sandwiched by a pair of silicon oxide films. The second insulating film 94 covers an upper surface and side surfaces of the first floating gate 92.

On the second insulating film 94, a first control gate 95, made of doped polysilicon, is formed in a line-like manner extending in the orthogonal direction. The first control gate 95 covers an upper surface and side surfaces of the second insulating film 94.

On the first insulating film 90, a second floating gate 96, made of doped polysilicon, is formed at a position opposing a region between the third impurity region 87 and the fourth impurity region 88 so as to span across these regions.

A portion of the second floating gate 96 opposes the fourth impurity region 88 across the first insulating film 90. In the first insulating film 90, a second tunnel window 97 is formed by decreasing a thickness of a part of a portion sandwiched between the fourth impurity region 88 and the second floating gate 96. For example, whereas the first insulating film 90 has a thickness of 200 to 400 Å, the first tunnel window 93 and the second tunnel window 97 are formed to a thickness of 70 to 100 Å.

A third insulating film 98 is formed on the second floating gate 96. The third insulating film 98 has, for example, the ONO structure in which a silicon nitride film is sandwiched by a pair of silicon oxide films. The third insulating film 98 covers an upper surface and side surfaces of the second floating gate 96.

On the third insulating film 98, a second control gate 99, made of doped polysilicon, is formed in a line-like manner extending in the orthogonal direction. The second control gate 99 covers an upper surface and side surfaces of the third insulating film 98.

Further, on the first insulating film 90, a second select gate 220, made of doped polysilicon, is formed in a line-like manner extending in the orthogonal direction at a position opposing a region between the fourth impurity region 88 and the fifth impurity region 89.

As shown in FIG. 14, an interlayer insulating film 221 is laminated on the semiconductor layer 82. The interlayer insulating film 221 is made, for example, of $SiO_2$. The first insulating film 90, the first select gate 91, the first control gate 95 and the second control gate 99 are covered all together by the interlayer insulating film 221.

A plurality of wirings (not shown) are formed on the interlayer insulating film 221, and contact plugs 222 and 223 for connecting the wirings with the first impurity region 85 and the fifth impurity region 89 respectively, are embedded in the interlayer insulating film 221. The contact plugs 222 and 223 are made, for example, of W (tungsten). In a top layer portion of the first impurity region 85, a contact region 224, having a higher N type impurity concentration than other portions, is formed at a portion connected to the contact plug 222. Further, in a top layer portion of the fifth impurity region 89, a contact region 225, having a higher N type impurity concentration than other portions, is formed at a portion connected to the contact plug 223.

As shown in FIG. 15, the first impurity region 85, the second impurity region 86, and the first select gate 91 opposing the region between the first impurity region 85 and the second impurity region 86 across the first insulating film 90 make up a first select transistor STr1. The second impurity region 86, the third impurity region 87, the first floating gate 92 opposing the region between the second impurity region 86 and the third impurity region 87 across the first insulating film 90, and the first control gate 95 opposing the first floating gate 92 across the second insulating film 94 make up a first memory transistor MTr1. The third impurity region 87, the fourth impurity region 88, the second floating gate 96 opposing the region between the third impurity region 87 and the fourth impurity region 88 across the first insulating film 90, and the second control gate 99 opposing the second floating gate 96 across the third insulating film 98 make up a second memory transistor MTr2. The fourth impurity region 88, the fifth impurity region 89, and the second select gate 220 opposing the region between the fourth impurity region 88 and the fifth impurity region 89 make up a second select transistor STr2.

Figure 16:
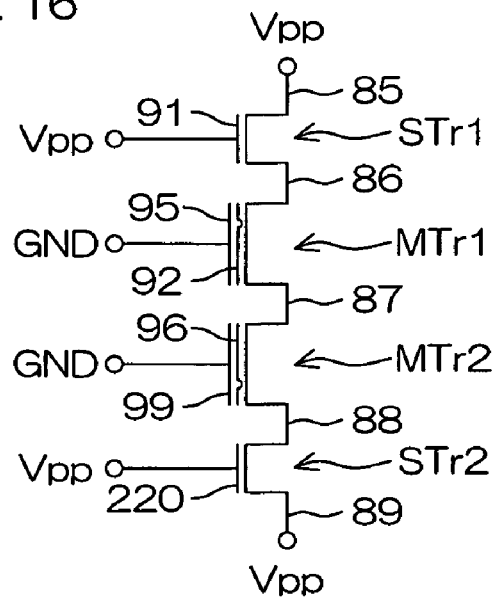
FIG. 16 is a circuit diagram for explaining an operation during writing of data into a first memory transistor and a second memory transistor shown in FIG. 15.

FIG. 16 is a circuit diagram for explaining an operation during writing of data into the first memory transistor and the second memory transistor shown in FIG. 15.

When data are to be written into the first memory transistor MTr1 and the second memory transistor MTr2, the first control gate 95 and the second control gate 99 are set to the ground potential (GND). The programming voltage Vpp is applied to the first impurity region 85 (the wiring connected to the contact plug 222), the first select gate 91, the second select gate 220 and the fifth impurity region 89 (the wiring connected to the contact plug 223). The first select transistor STr1 and the second select transistor STr2 are thereby turned on and high electric fields are formed between the second impurity region 86 and the first floating gate 92 and between the fourth impurity region 88 and the second floating gate 96 respectively. By the high electric fields, electrons are drawn from the first floating gate 92 and the second floating gate 96 into the second impurity region 86 and the fourth impurity region 88 respectively, thereby achieving writing of the same data into the first memory transistor MTr1 and the second memory transistor MTr2.

There is no path through which leakage of current occurs during the writing of the data, and the programming voltage Vpp applied to the first impurity region 85 and the fifth impurity region 89 thus contributes efficiently to the drawing of electrons from the first floating gate 92 and the second floating gate 96 respectively. Further, the same data can be written simultaneously into the first memory transistor MTr1 and the second memory transistor MTr2, and the writing of data can thus be achieved in a shorter time than in an arrangement where the same data are written in tandem into the first memory transistor MTr1 and the second memory transistor MTr2. Improvement of the data writing efficiency and reduction of the data writing time can thus be achieved.

Further, with the EEPROM 81, the impurity regions 85 to 89 are formed so as to be aligned in that order from one end side to the other end side in the longitudinal direction of the active region 83 having the rectangular view in plan view. By this layout, the active region 83 can be reduced in size in comparison to a layout where the impurity regions 85 to 89 are formed without being aligned.

Still further, the third impurity region 87 is formed at the central portion in the longitudinal direction of the active region 83, the first impurity region 85 and the fifth impurity region 89 are formed at the positions that are mutually symmetrical with respect to the center in the longitudinal direction of the active region 83, and the second impurity region 86 and the fourth impurity region 88 are formed at the positions that are mutually symmetrical with respect to the center in the longitudinal direction of the active region 83. With this layout, respective spaces between the third impurity region 87 and the second impurity region 86 and between the third impurity region 87 and the fourth impurity region 88 (respective channel regions of the first memory transistor MTr1 and the second memory transistor MTr2) are equal, and the size of the active region 83 can thus be reduced in comparison to a case where one of the spaces is made larger than the others. Further, a space between the first impurity region 85 and the second impurity region 86 (channel region of the first select transistor STr1) and a space between the fourth impurity region 88 and the fifth impurity region 89 (channel region of the second select transistor STr2) are equal, and the size of the active region 83 can thus be reduced in comparison to a case where one of the spaces is made larger than the other.

Figure 21:
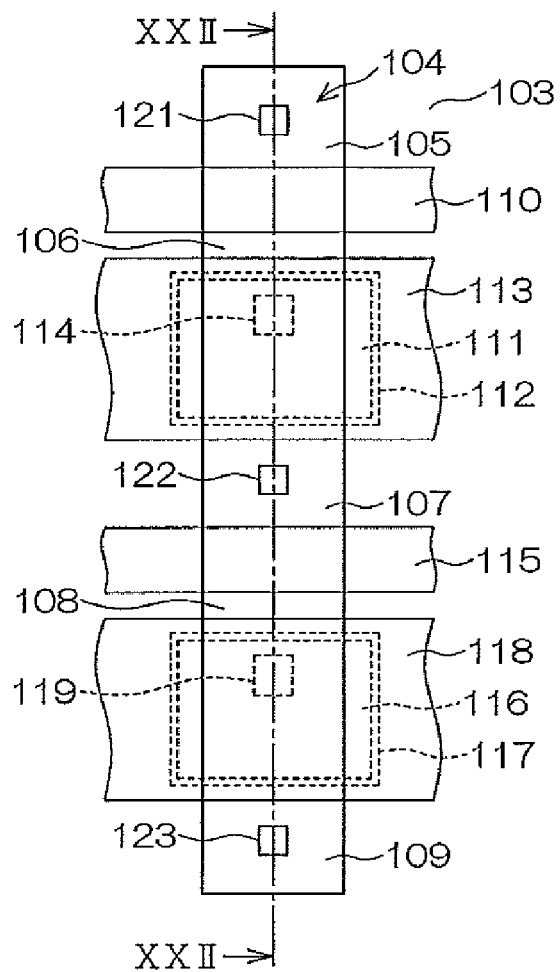
FIG. 21 is a schematic plan view of a conventional W cell type EEPROM.
Figure 22:
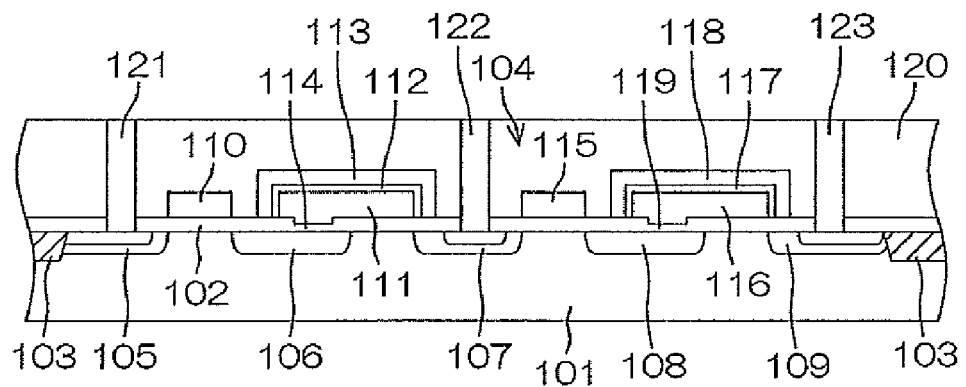
FIG. 22 is a schematic sectional view taken on cutting line XXII-XXII of the EEPROM shown in FIG. 21.
Figure 23:
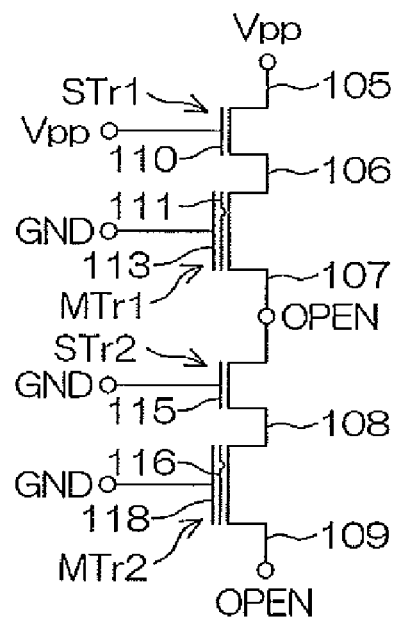
FIG. 23 is a circuit diagram for explaining an operation during writing of data into a first memory transistor of the EEPROM shown in FIG. 21.
Figure 24:
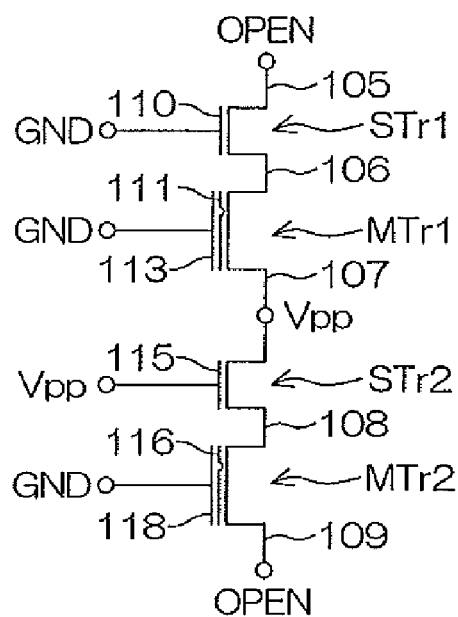
FIG. 24 is a circuit diagram for explaining an operation during writing of data into a second memory transistor of the EEPROM shown in FIG. 21.

Further, with the EEPROM 81, a contact plug connected to a top surface of the third impurity region 87 is not required, and the size of the third impurity region 87 can thus be reduced in comparison to the conventional EEPROM (see FIG. 21). The size of the active region 83 can thus be reduced further.

Figure 17:
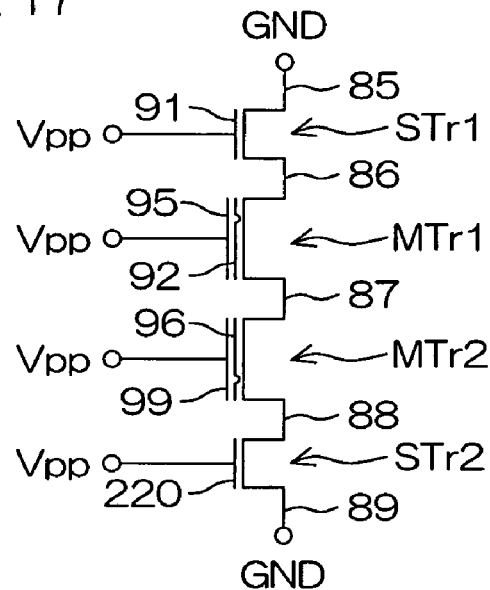
FIG. 17 is a circuit diagram for explaining an operation during deletion of data from the first memory transistor and the second memory transistor shown in FIG. 15.

FIG. 17 is a circuit diagram for explaining an operation during deletion of data from the first memory transistor and the second memory transistor shown in FIG. 15.

When data are to be deleted from the first memory transistor MTr1 and the second memory transistor MTr2, the first impurity region 85 (the wiring connected to the contact plug 222) and the fifth impurity region 89 (the wiring connected to the contact plug 223) are set to the ground potential (GND). Then, the programming voltage Vpp is applied to the first select gate 91, the first control gate 95, the second control gate 99 and the second select gate 220. Electrons thus flow into the second impurity region 86 and the fourth impurity region 88 from the first impurity region 85 and the fifth impurity region 89 respectively. As a result, high electric fields are formed between the second impurity region 86 and the first floating gate 92 and between the fourth impurity region 88 and the second floating gate 96 respectively, and electrons are FN tunneled and implanted from the second impurity region 86 and the fourth impurity region 88 into the first floating gate 92 and the second floating gate 96 respectively, through the first tunnel window 93 and the second tunnel window 97.

Figure 18:
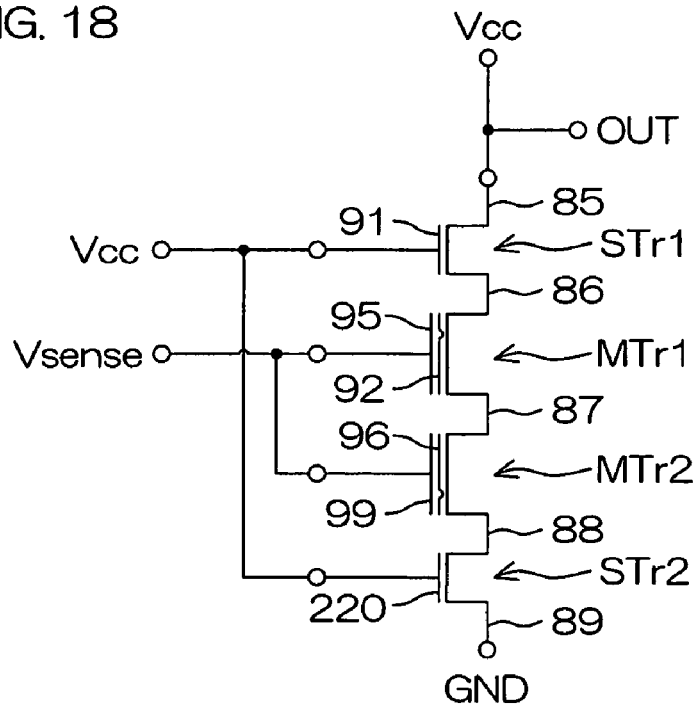
FIG. 18 is a circuit diagram for explaining an operation during reading of data from the first memory transistor and the second memory transistor shown in FIG. 15.

FIG. 18 is a circuit diagram for explaining an operation during reading of data from the first memory transistor and the second memory transistor shown in FIG. 15.

Respective threshold voltages of the first memory transistor MTr1 and the second memory transistor MTr2 (voltages necessary for respectively turning on the first memory transistor MTr1 and the second memory transistor MTr2) differ between a state in which electrons are accumulated in the first floating gate 92 and the second floating gate 96 and a state in which electrons are not accumulated. That is, in the state in which electrons are accumulated in the first floating gate 92 and the second floating gate 96 (deletion state), each threshold voltage is a relatively high voltage Vth(1), and in the state in which electrons are not accumulated in the first floating gate 92 and the second floating gate 96 (writing state), each threshold voltage is a relatively low voltage Vth(0).

When data are to be read from the first memory transistor MTr1 and the second memory transistor MTr2, the fifth impurity region 89 (the wiring connected to the contact plug 223) is set to the ground potential (GND). Further, the predetermined voltage Vcc (for example, 2 to 5V) is applied to the first impurity region 85 (the wiring connected to the contact plug 222), the first select gate 91 and the second select gate 220. Then, the sense voltage Vsense (for example, 1 to 2V) of the value intermediate the voltage Vth(1) and the voltage Vth(0) is applied to the first control gate 95 and the second control gate 99. If the first memory transistor MTr1 and the second memory transistor MTr2 remain off by the application of the sense voltage Vsense, the predetermined voltage Vcc is output to an output wiring (OUT) connected to the first impurity region 85, and the logic signal "1" can be obtained. Meanwhile, if the first memory transistor MTr1 and the second memory transistor MTr2 turn on by the application of the sense voltage Vsense, the ground potential (GND) is output to the output wiring (OUT), and the logic signal "0" can be obtained.

Figure 19:
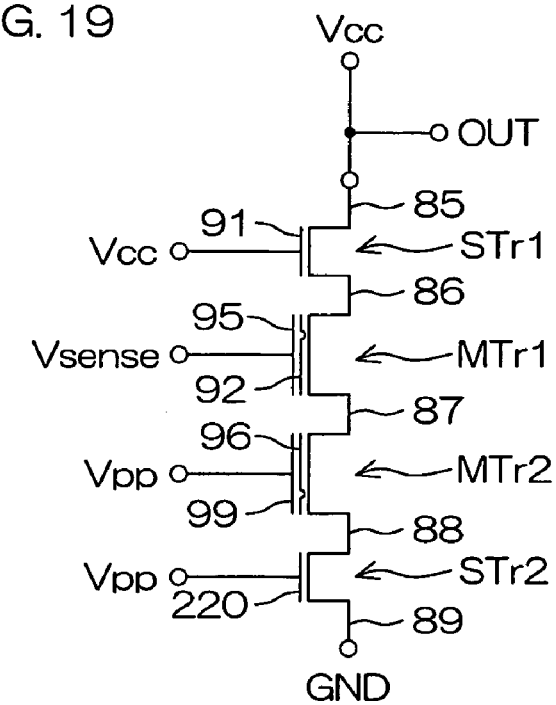
FIG. 19 is a circuit diagram for explaining an operation during reading of data from only the first memory transistor shown in FIG. 15.

FIG. 19 is a circuit diagram for explaining an operation during reading of data from only the first memory transistor shown in FIG. 15.

When data are to be read from the first memory transistor MTr1, the fifth impurity region 89 (the wiring connected to the contact plug 223) is set to the ground potential (GND). Further, the predetermined voltage Vcc is applied to the first impurity region 85 (the wiring connected to the contact plug 222) and the first select gate 91. Further, the programming voltage Vpp is applied to the second control gate 99 and the second select gate 220. By the application of the programming voltage Vpp, the second memory transistor MTr2 turns on regardless of the state of accumulation of electrons in the second floating gate 19. Then, the sense voltage Vsense is applied to the first control gate 95 and the second control gate 99. If the first memory transistor MTr1 remains off by the application of the sense voltage Vsense, the predetermined voltage Vcc is output to the output wiring (OUT) connected to the first impurity region 85, and the logic signal "1" can be obtained. Meanwhile, if the first memory transistor MTr1 turns on by the application of the sense voltage Vsense, the ground potential (GND) is output to the output wiring (OUT), and the logic signal "0" can be obtained.

Figure 20:
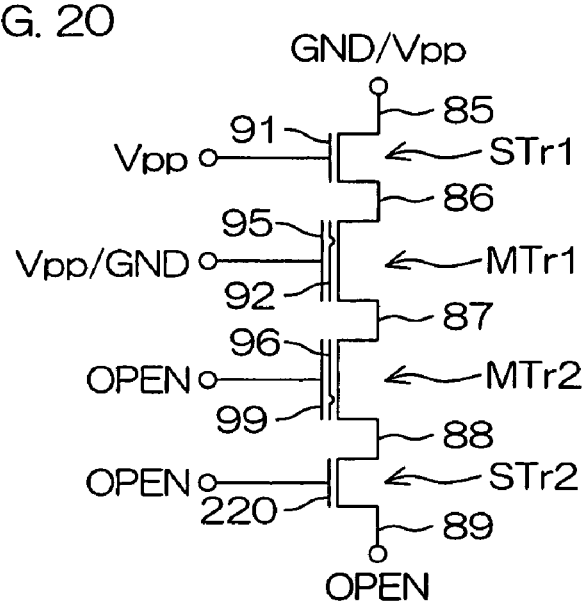
FIG. 20 is a circuit diagram for explaining operations during writing and deletion of data into and from only the first memory transistor shown in FIG. 15.

FIG. 20 is a circuit diagram for explaining operations during writing and deletion of data into and from only the first memory transistor shown in FIG. 15.

When data are to be written into the first memory transistor MTr1, the fifth impurity region 89 (the wiring connected to the contact plug 223), the second control gate 99 and the second select gate 220 are put in the open state. Further, the first control gate 95 is set to the ground potential (GND). Then, the programming voltage Vpp is applied to the first impurity region 85 (the wiring connected to the contact plug 222) and the first select gate 91. The first select transistor STr1 is thereby turned on and a high electric field is formed between the second impurity region 86 and the first floating gate 92. By the high electric field, electrons are drawn from the first floating gate 92 into the second impurity region 86, thereby achieving writing of data into the first memory transistor MTr1.

Meanwhile, when data are to be deleted from the first memory transistor MTr1, the fifth impurity region 89 (the wiring connected to the contact plug 223), the second control gate 99 and the second select gate 220 are put in the OPEN state. Further, the first impurity region 85 (the wiring connected to the contact plug 222) is set to the ground potential (GND). The programming voltage Vpp is applied to the first select gate 91 and the first control gate 95. Electrons thus flow into the second impurity region 86 from the first impurity region 85. As a result, a high electric field is formed between the second impurity region 86 and the first floating gate 92, and electrons are FN tunneled and implanted from the second impurity region 86 into the first floating gate 92 through the first tunnel window 93.

In addition, in each of the EEPROMs 1, 71 and 81, a structure where the conductive types (P type and N type) of the respective semiconductor portions are inverted may be adopted.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-306674 filed with the Japan Patent Office on Dec. 1, 2008, and Japanese Patent Application No. 2008-313302 filed therewith on Dec. 9, 2008, the disclosure of these applications are incorporated herein by reference.

What is claimed is:

1. An EEPROM comprising:
a semiconductor layer of a first conductive type;
a first insulating film formed on the semiconductor layer;
an element isolation portion formed selectively in a top surface of the semiconductor layer and surrounding an active region;
a first impurity region of a second conductive type formed in a top layer portion of the semiconductor layer in the active region;
a second impurity region of the second conductive type formed at an interval from the first impurity region in a top layer portion of the semiconductor layer in the active region;
a select gate formed on the first insulating film and opposing a region between the first impurity region and the second impurity region;
a third impurity region of the second conductive type formed at an interval from the second impurity region in a top layer portion of the semiconductor layer in the active region;
a first floating gate formed on the first insulating film and opposing a region between the second impurity region and the third impurity region;
a second insulating film formed on the first floating gate;
a first control gate formed on the second insulating film;
a fourth impurity region of the second conductive type formed at an interval from the third impurity region in a top layer portion of the semiconductor layer in the active region;
a second floating gate formed on the first insulating film and opposing a region between the third impurity region and the fourth impurity region;
a third insulating film formed on the second floating gate;
a second control gate formed on the third insulating film;
a first tunnel window formed by decreasing a thickness of a part of a portion of the first insulating film in contact with the first floating gate;
a fifth impurity region of the second conductive type formed in a portion of the top layer portion of the semiconductor layer opposing the first tunnel window and connected to the second impurity region;
a second tunnel window formed by decreasing a thickness of a part of a portion of the first insulating film in contact with the second floating gate; and
a sixth impurity region of the second conductive type formed in a portion of the top layer portion of the semiconductor layer opposing the second tunnel window and connected to the second impurity region.

2. The EEPROM according to claim 1, wherein
the fifth impurity region and the sixth impurity region are adjacent and integral in a predetermined direction, and
the sixth impurity region is connected to the second impurity region via the fifth impurity region.

3. The EEPROM according to claim 2, wherein
the first impurity region opposes the second impurity region in the predetermined direction,
the second impurity region extends in a direction orthogonal to the predetermined direction,
the third impurity region opposes, in the predetermined direction at a side opposite the first impurity region side, one end portion of the second impurity region in the direction orthogonal to the predetermined direction,
the fourth impurity region opposes the third impurity region in the predetermined direction, the fifth impurity region is connected, from the side opposite the first impurity region side, to the other end portion of the second impurity region at the opposite side of the one end portion, and the select gate, the first floating gate and the second floating gate extend in the direction orthogonal to the predetermined direction.

4. The EEPROM according to claim 3, wherein
the active region comprises: a first portion extending in the predetermined direction; a second portion extending in the predetermined direction and spaced from the first portion in the direction orthogonal to the predetermined direction; and a third portion connecting respective one end portions in the predetermined direction of the first portion and the second portion;

the first impurity region and the second impurity region are formed in the third portion, the third impurity region and the fourth impurity region are formed in the first portion, and the fifth impurity region and the sixth impurity region are formed in the second portion.

5. An EEPROM according to claim 2, wherein
the first tunnel window and the second tunnel window are adjacent and integral in the predetermined direction.

* * * * *